(12) United States Patent
Li et al.

(10) Patent No.: US 11,696,503 B2
(45) Date of Patent: Jul. 4, 2023

(54) TWO-DIMENSIONAL THERMAL ELECTRIC GENERATORS

(71) Applicant: GEORGE MASON UNIVERSITY, Fairfax, VA (US)

(72) Inventors: Qiliang Li, Fairfax, VA (US); Sheng Yu, Fairfax, VA (US); Abbas Arab, Fairfax, VA (US)

(73) Assignee: George Mason University, Fairfax, VA (US)

( * ) Notice: Subject to any disclaimer, the term of this patent is extended or adjusted under 35 U.S.C. 154(b) by 422 days.

(21) Appl. No.: 16/784,965

(22) Filed: Feb. 7, 2020

(65) Prior Publication Data

US 2020/0194647 A1 Jun. 18, 2020

Related U.S. Application Data

(62) Division of application No. 15/574,065, filed as application No. PCT/US2016/034445 on May 26, 2016, now Pat. No. 10,593,856.

(Continued)

(51) Int. Cl.
| | |
|---|---|
| *H10N 10/852* | (2023.01) |
| *H10N 10/00* | (2023.01) |
| *B82Y 30/00* | (2011.01) |
| *H02N 2/18* | (2006.01) |
| *H01L 31/0352* | (2006.01) |
| *H10N 10/01* | (2023.01) |
| *H10N 10/80* | (2023.01) |
| *H10N 30/30* | (2023.01) |

(Continued)

(52) U.S. Cl.
CPC ... *H10N 10/852* (2023.02); *H01L 31/035227* (2013.01); *H02N 2/18* (2013.01); *H10N 10/00* (2023.02); *H10N 10/01* (2023.02); *H10N 10/80* (2023.02); *H10N 30/30* (2023.02); *H10N 30/85* (2023.02); *B82Y 30/00* (2013.01); *H01L 21/02568* (2013.01)

(58) Field of Classification Search
CPC ......... H01L 35/00; H01L 35/02; H01L 35/16; B82Y 30/00; H10N 10/852; H10N 10/00
See application file for complete search history.

(56) References Cited

U.S. PATENT DOCUMENTS

| | | |
|---|---|---|
| 10,593,856 B2 | 3/2020 | Li et al. |
| 2004/0155310 A1 | 8/2004 | Hirano et al. |

(Continued)

FOREIGN PATENT DOCUMENTS

| | | |
|---|---|---|
| WO | PCT/US2016/034445 | 5/2016 |
| WO | WO-2016/191606 A1 | 12/2016 |

OTHER PUBLICATIONS

Fan, D.D. et al., "MoS2 nanoribbons as promising thermoelectric materials", Applied Physics Letters 105, 133113, pp. 1-5. (Year: 2014).*

(Continued)

*Primary Examiner* — Tamir Ayad
(74) *Attorney, Agent, or Firm* — Ballard Spahr LLP

(57) ABSTRACT

Devices for generating electrical energy along with methods of fabrication and methods of use are disclosed. An example device can comprise one or more layers of a transition metal dichalcogenide material. An example device can comprise a mechano-electric generator. Another example device can comprise a thermoelectric generator.

15 Claims, 27 Drawing Sheets

Related U.S. Application Data

(60) Provisional application No. 62/166,537, filed on May 26, 2015.

(51) Int. Cl.
 *H10N 30/85* (2023.01)
 *H01L 21/02* (2006.01)

(56) References Cited

U.S. PATENT DOCUMENTS

| | | | |
|---|---|---|---|
| 2008/0276979 A1* | 11/2008 | Lagally | H01L 29/0673 257/E29.022 |
| 2010/0170553 A1 | 7/2010 | Rhyee et al. | |
| 2013/0269761 A1 | 10/2013 | Ardo et al. | |
| 2014/0017839 A1 | 1/2014 | Li et al. | |
| 2015/0083206 A1 | 3/2015 | Novoselov et al. | |
| 2018/0323359 A1 | 11/2018 | Li et al. | |
| 2019/0052195 A1 | 2/2019 | Pint et al. | |
| 2019/0226463 A1 | 7/2019 | Feng et al. | |

OTHER PUBLICATIONS

Wickramaratne, Darshana et al. "Electronic and thermoelectric properties of few-layer transition metal chalcogenides", The Journal of Chemical Physics 140, 124710, pp. 1-13. (Year: 2014).*

U.S. Appl. No. 62/166,537, filed May 26, 2015, Qiliang Li.

U.S. Appl. No. 15/574,065, filed May 26, 2016, (U.S. Pat. No. 10,593,856), (Mar. 17, 2020), Qiliang Li.

International Search Report and Written Opinion dated Oct. 4, 2016 by the International Searching Authority for International Application No. PCT/US2016/034445, filed on May 26, 2016 and published as WO 2016/191606 on Dec. 1, 2016 (Applicant—Geordge Mason University) (9 Pages).

International Preliminary Report on Patentability dated Nov. 28, 2017 by the International Searching Authority for International Application No. PCT/US2016/034445, filed on May 26, 2016 and published as WO 2016/191606 on Dec. 1, 2016 (Applicant—Geordge Mason University) (6 Pages).

* cited by examiner

Sulphur  Molybdenum

Mono-Layer {

} Coupled by van der Waals force

TWO-DIMENSIONAL THERMAL ELECTRIC GENERATORS

CROSS REFERENCE TO RELATED PATENT APPLICATIONS

This application is a divisional of U.S. application Ser. No. 15/574,065, filed on Nov. 14, 2017, which is a U.S. National Phase of International Application No. PCT/US2016/034445, filed on May 26, 2016, which claims priority to U.S. Provisional Application No. 62/166,537, filed on May 26, 2015, each of which are incorporated by reference herein in their entireties.

STATEMENT REGARDING FEDERALLY SPONSORED RESEARCH

This invention was made with government support under grant number ECCS-1407807 awarded by the National Science Foundation. The government has certain rights in the invention.

SUMMARY

It is to be understood that both the following general description and the following detailed description are exemplary and explanatory only and are not restrictive, as claimed. Provided are devices for generating electrical energy and corresponding methods of use and fabrication.

An example device can comprise a first portion of a layer comprising a p-type transition metal dichalcogenide material. The first portion can have a first side and a second side opposite the first side. The device can comprise a second portion of the layer comprising a n-type transition metal dichalcogenide material. The second portion can have a third side and a fourth side opposite the third side. The first side of the first portion and the third side of the second portion can form a PN junction. The device can comprise a first electrode of the layer adjacent to the second side of the first portion of the layer and a second electrode of the layer adjacent to the fourth side of the second portion of the layer. The layer can be configured to provide electrical energy via one or more of the first electrode or the second electrode in response to receiving mechanical energy at the layer.

Another example device can comprise a first nanostructure comprising a n-type transition metal dichalcogenide material, a second nanostructure comprising a p-type transition metal dichalcogenide material, an electrical interconnect coupling the first nanostructure to the second nanostructure, a first electrode coupled to the first nanostructure, and a second electrode coupled to the second nanostructure. The first nanostructure and the second nanostructure can be together configured to provide electrical energy via one or more of the first electrode or the second electrode in response to receiving thermal energy at one or more of the first nanostructure and the second nanostructure. An example method for fabricating a device can comprise forming a first transition metal dichalcogenide material layer, forming a first insulating layer on top of the first transition metal dichalcogenide material layer, and forming a second transition metal dichalcogenide material layer on top of the second insulating layer. The first transition metal dichalcogenide material layer, the second transition metal dichalcogenide material layer, the first insulating layer, and the second insulating layer can be formed as part of a wafer. The method can further comprise dividing the wafer into a plurality of subsections and assembling the plurality of subsections of the wafer into an array of components of a circuit.

Additional advantages will be set forth in part in the description which follows or may be learned by practice. The advantages will be realized and attained by means of the elements and combinations particularly pointed out in the appended claims.

BRIEF DESCRIPTION OF THE DRAWINGS

The accompanying drawings, which are incorporated in and constitute a part of this specification, illustrate embodiments and together with the description, serve to explain the principles of the methods and systems.

DETAILED DESCRIPTION

Figure 1:
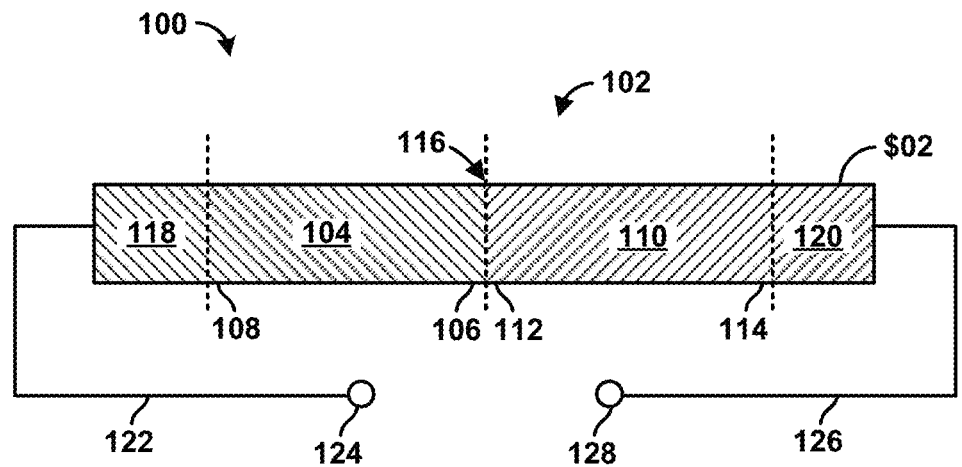
FIG. 1 illustrates an example device for generating electrical energy.

Before the present methods and systems are disclosed and described, it is to be understood that the methods and systems are not limited to specific methods, specific components, or to particular implementations. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Ranges may be expressed herein as from "about" one particular value, and/or to "about" another particular value. The term "about" is used herein to mean approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 20%. When such a range is expressed, an aspect includes from the one particular value and/or to the other particular value. Similarly, when values are expressed as approximations, by use of the antecedent "about," it will be understood that the particular value forms an aspect. It will be further understood that the endpoints of each of the ranges are significant both in relation to the other endpoint, and independently of the other endpoint.

The word "or" as used herein means any one member of a particular list and also includes any combination of members of that list.

The term "about" or "approximately" means within an acceptable error range for the particular value as determined by one of ordinary skill in the art, which will depend in part on how the value is measured or determined, i.e., the limitations of the measurement system. For example, "about" can mean within 1 or more than 1 standard deviation, per the practice in the art. Alternatively, "about" can mean a range of up to 20%, preferably up to 10%, more preferably up to 5%, and more preferably still up to 1% of a given value. Where particular values are described in the application and claims, unless otherwise stated the term "about" meaning within an acceptable error range for the particular value should be assumed.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the examples included therein and to the Figures and their previous and following description.

The present disclosure relates to devices configured for converting energy, such as mechanical or thermal energy, into electrical energy. The devices can comprise one or more layers of transition metal dichalcogenide material. For example, a mechano-electrical generator can utilize a layer of transition metal dichalcogenide material having a PN junction to convert mechanical energy into electrical energy. As another example, a thermo-electrical generator can utilize multiple layers of transition metal dichalcogenide material to convert thermal energy into electrical energy.

FIG. 1 illustrates an example device for generating electrical energy. For the example, the device 100 can comprise a mechano-electrical generator. The device 100 can be configured to convert mechanical energy into electrical energy (e.g., current, voltage).

In an aspect, the device 100 can comprise a layer 102 (e.g., nanoribbon, nanostructure). The layer 102 can comprise a material. The material can be a semiconductor, a metal, and/or the like. The properties (e.g., conductive properties) of the layer 102 can be related to the size, shape, boundaries and/or the like of the layer 102. The energy band structure and/or the electron density can be adjusted or selected by varying the size and/or boundary condition of the layer 102. For example, a narrower layer 102 (e.g., of $MoS_2$) leads to a smaller energy band gap, and therefore, larger conductivity. In an aspect, the layer 102 can have a length and/or width on a nanometer scale. In an aspect, the material can comprise a transition metal dichalcogenide material. The transition metal dichalcogenide can comprise a transition metal (e.g., molybdenum, tungsten). The transition metal dichalcogenide can comprise sulfur, selenium, tellurium, a combination thereof, and/or the like. For example, the transition metal dichalcogenide material can comprise molybdenum disulfide ($MoS_2$), tungsten sulfide ($WS_2$), molybdenum diselenide ($MoSe_2$), Tungsten diselenide ($WSe_2$), molybdenum ditelluride ($MoTe_2$), a combination thereof, and/or the like.

The layer 102 can comprise a two-dimensional monolayer. For example, the layer can comprise a nanoribbon. The monolayer can comprise a single layer (e.g., single sheet) of atoms (e.g., or molecules) extending in only two orthogonal directions. The layer 102 can comprise a few layer nanostructure (e.g., thin film). A few layer nanostructure can comprise two layers, three layers, four layers, and/or the like. In an aspect, the layer 102 can be flexible. For example, the layer 102 can be deformed (e.g., bent, stretched, compressed) along the length and/or width of the layer 102. In some implementations, the layer 102 can be rigid or semi-rigid.

The layer 102 can comprise a first portion 104. The first portion 104 can comprise a p-type transition metal dichalcogenide material. The first portion 104 can have a first side 106 and a second side 108 opposite the first side 106. The layer 102 can comprise a second portion 110 comprising a n-type transition metal dichalcogenide material. The second portion 110 can have a third side 112 and a fourth side 114 opposite the third side 112.

As an example, the p-type transition metal dichalcogenide material can be doped with phosphorus. The n-type transition metal dichalcogenide material can be doped with chlorine. A single atom or multiple atoms can be used for doping.

As an example, the p-type transition metal dichalcogenide material and the n-type transition metal dichalcogenide material can comprise molybdenum disulfide. The p-type transition metal dichalcogenide material can comprise molybdenum disulfide doped with phosphorus. The n-type transition metal dichalcogenide material can comprise molybdenum disulfide doped with chlorine.

The layer 102 can comprise a PN junction 116. For example, the first side 106 of the first portion 104 and the third side 112 of the second portion 110 can form a PN junction 116.

In an aspect, the PN junction 116 can comprise a heterojunction. For example, the first portion 104 can comprise a first material. The second portion 110 can comprise a second material. The second material can be or comprise a different material than the first material. Both the first material and the second material can comprise transition metal dichalcogenide materials. For example, the first material can comprise a first transition metal dichalcogenide material. The second material can comprise a second transition metal dichalcogenide material. For example, the heterojunction can comprise tungsten diselenide and molybdenum disulfide. The heterojunction can comprise an combination of molybdenum disulfide ($MoS_2$), tungsten sulfide ($WS_2$), molybdenum diselenide ($MoSe_2$), tungsten diselenide ($WSe_2$), molybdenum ditelluride ($MoTe_2$). As a further example, the heterojunction can comprise $WSe_2$ as the first material and $MoS_2$ as the second material, $WSe_2$ as the first material and $MoSe_2$ as the second material, $WS_2$ as the first material and $MoS_2$ as the second material, $WS_2$ as the first material and $MoSe_2$ as the second material, and/or the like.

The layer 102 can comprise a first electrode 118. The first electrode 118 can be adjacent to the second side 108 of the first portion 104 of the layer 102. The layer 102 can comprise a second electrode 120. The second electrode 120 can be adjacent to the fourth side 114 of the second portion 110 of the layer 102. The first electrode 118 can be electrically coupled (e.g., attached, connected) to a first wire 122 having a first terminal 124. The second electrode 120 can be electrically coupled to a second wire 126 having a second terminal 128. The device 100 can deliver, supply, and/or provide the electrical energy via the first terminal 124 and/or the second terminal 128. For example, positive or negative voltage (e.g., potential difference) can form between the first terminal 124 and the second terminal 128.

Figure 7A:
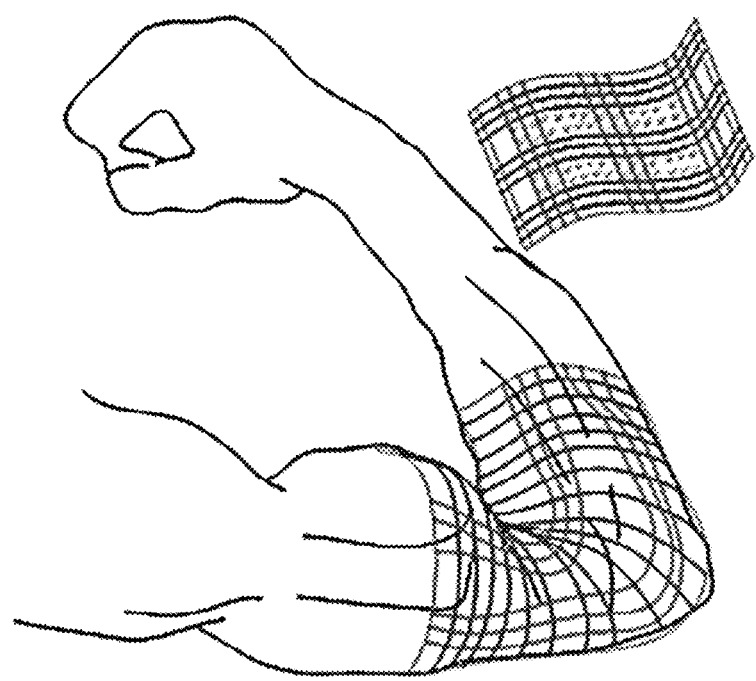
FIG. 7A illustrates carry-on electronics with mechano-electric generator based on 2D semiconductors.

The layer 102 can be configured to provide electrical energy (e.g., current, voltage, power) via one or more of the first electrode 118 or the second electrode 120 in response to receiving mechanical energy at the layer 102. The first electrode 118 and/or second electrode 120 can provide the electrical energy via the first terminal 124 and/or second terminal 128. Mechanical energy can be received at the device 100 (e.g., at the layer 102) as any kind of mechanical force, such as stress, strain, pressure, compression, torque, tension, deformation, expansion (e.g., stretching), and/or the like. As an illustration, the device 100 can incorporated into a wearable device. As a user of the wearable device moves, mechanical energy from the user can be received at the device 100 (e.g., at the layer 102) and converted into electrical energy. Example movement of a user's arm wearing the device 100 is shown in FIG. 7A. The electrical energy can be used to power, at least in part, the wearable device. The electrical energy can be used to charge a battery and/or a capacitor of the wearable device. The mechanical energy (e.g., mechanical force) can be at least (e.g., or primarily) along a length of the layer 102. The mechanical energy (e.g., mechanical force) can be at least (e.g., or primarily) along a width of the layer 102.

Figure 2:
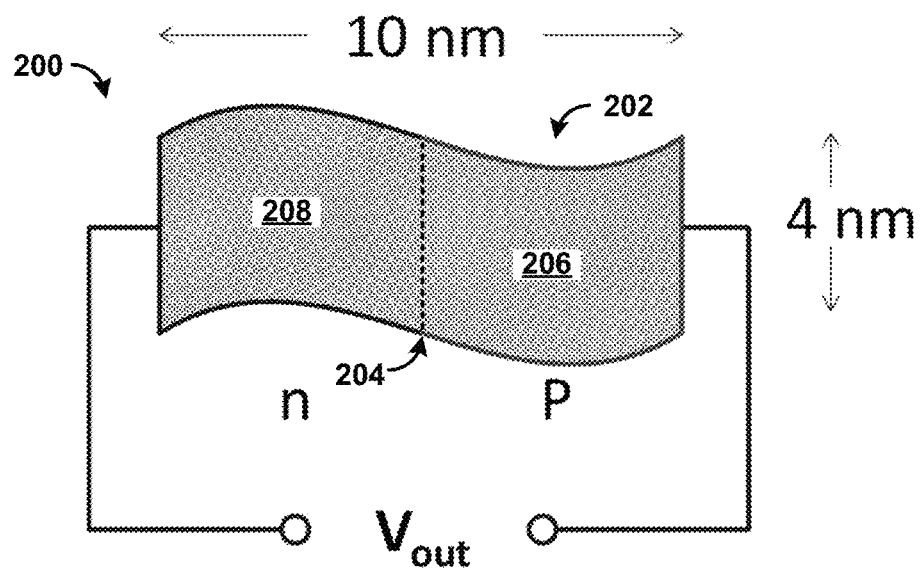
FIG. 2 shows another example device for generating electrical energy.

FIG. 2 shows another example device 200 for generating electrical energy. The device 200 can comprise a specific embodiment of the device 100 of FIG. 1. For example, the device 200 can comprise a nanoribbon 202 (e.g., or layer, nanostructure). The length of the nanoribbon 202 can be approximately 10 nm. The width of the nanoribbon 202 can be approximately 4 nm. These measurements are only used for the purposes of illustration and are not meant to be limiting. Those of ordinary skill in the art understand that the nanoribbon 202 may have a variety of different dimensions according to design requirements. The nanoribbon 202 can comprise $MoS_2$. The nanoribbon 202 can comprise a PN junction 204 between a p-doped portion 206 of the nanoribbon 202 and the n-doped portion 208 of the nanoribbon 202. The nanoribbon 202 can generate an output voltage when the nanoribbon 202 is strained by stressing or bending.

Figure 3:
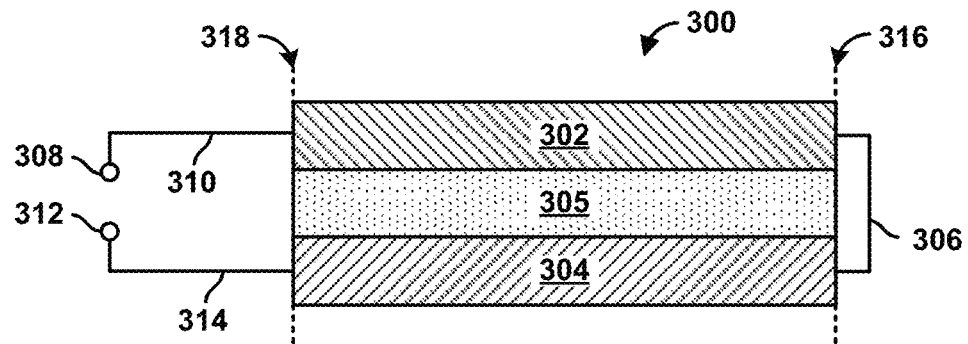
FIG. 3 illustrates another example device for generating electrical energy.

FIG. 3 illustrates another example device 300 for generating electrical energy. The example device 300 can comprise a thermoelectric generator configured to convert thermal energy into electrical energy (e.g., current, voltage, power).

The device 300 can comprise a first nanostructure 302 (e.g., layer, nanoribbon). The first nanostructure 302 can comprise a first material. The first material can be a semiconductor, a metal, and/or the like. The properties (e.g., conductive properties) of the first nanostructure 302 can be related to the size, shape, boundaries and/or the like of the first nanostructure 302. The energy band structure and/or the electron density can be adjusted or selected by varying the size and/or boundary condition of the first nanostructure 302. For example, a narrower first nanostructure 302 (e.g., of $MoS_2$) leads to a smaller energy band gap, and therefore, larger conductivity. In an aspect, the first nanostructure 302 can have a length and/or width on a nanometer scale. In an aspect, the first material can comprise a transition metal dichalcogenide material. The transition metal dichalcogenide can comprise a transition metal (e.g., molybdenum, tungsten). The transition metal dichalcogenide can comprise sulfur, selenium, tellurium, a combination thereof, and/or the like. For example, the transition metal dichalcogenide material can comprise molybdenum disulfide ($MoS_2$), tungsten sulfide ($WS_2$), molybdenum diselenide ($MoSe_2$), tungsten diselenide ($WSe_2$), molybdenum ditelluride ($MoTe_2$), a combination thereof, and/or the like. The first material can comprise a n-type or p-type transition metal dichalcogenide material.

The device 300 can comprise a second nanostructure 304 (e.g., layer, nanoribbon). The second nanostructure 304 can comprise a second material. The first material can be a semiconductor, a metal, and/or the like. The properties (e.g., conductive properties) of the second nanostructure 304 can be related to the size, shape, boundaries and/or the like of the second nanostructure 304. The energy band structure and/or the electron density can be adjusted or selected by varying the size and/or boundary condition of the second nanostructure 304. For example, a narrower second nanostructure 304 (e.g., of $MoS_2$) leads to a smaller energy band gap, and therefore, larger conductivity. In an aspect, the second nanostructure 304 can have a length and/or width on a nanometer scale. In an aspect, the second material can comprise a transition metal dichalcogenide material. The transition metal dichalcogenide can comprise a transition metal (e.g., molybdenum, tungsten). The transition metal dichalcogenide can comprise sulfur, selenium, tellurium, a combination thereof, and/or the like. For example, the transition metal dichalcogenide material can comprise molybdenum disulfide ($MoS_2$), tungsten sulfide ($WS_2$), molybdenum diselenide ($MoSe_2$), tungsten diselenide ($WSe_2$), molybdenum ditelluride ($MoTe_2$), a combination thereof, and/or the like. The second material can comprise a p-type or n-type transition metal dichalcogenide material. As an illustration, the p-type transition metal dichalcogenide material and the n-type transition metal dichalcogenide material can both comprise molybdenum disulfide.

The first nanostructure 302 can comprise a nanostructure having a monolayer, bi-layer, tri-layer, or any appropriate number of layers. The number of layers can determine whether the first nanostructure 302 and/or the second nanostructure 304 are p-type or n-type materials. The second nanostructure 304 can comprise a nanostructure having a monolayer, bi-layer, tri-layer, or any appropriate number of layers. For example, the n-type transition metal dichalcogenide material can have fewer layers than the p-type transition metal dichalcogenide material. For example, the n-type transition metal dichalcogenide material can be or comprise a monolayer material. The p-type transition metal dichalcogenide material can be or comprise a multilayer material. The multilayer material can be or comprise a bi-layer material.

In an aspect, The first nanostructure 302 can comprise a first nanoribbon. The second nanostructure 304 can comprise a second nanoribbon. In an aspect, the first nanostructure 302 (e.g., first nanoribbon) and/or the second nanostructure 304 (e.g., second nanoribbon) can have atoms arranged in an armchair pattern. The first nanoribbon and/or the second nanoribbon can have atoms arranged in a zigzag pattern.

In an aspect, the device 300 can comprise an insulating layer 305. The insulating layer 305 can be disposed between the first nanostructure 302 and the second nanostructure 304. For example, the insulating layer 305 can comprise a silicon dioxide, aluminum oxide, and/or the like. In some embodiments, the second nanostructure 304 can be disposed on an additional insulating later.

The first nanostructure 302 can disposed electrically in series with the second nanostructure 304. The device 300 can comprise an electrical interconnect 306 (e.g., wire) coupling the first nanostructure 302 to the second nanostructure 304. The electrical interconnect 306 can comprise a plate, wire, layer, sheet, and/or the like. The electrical interconnect 306 can comprise a conductive material, such as a metal.

The device 300 can comprise a first electrode 308 (e.g. or first terminal) coupled to (e.g., electrically coupled, mechanically coupled, attached, affixed, extending from) the first nanostructure 302. The first electrode 308 can be coupled to the first nanostructure 302 via a first wire 310. The first electrode 308 can comprise a conductive material, such as a metal. The device 300 can comprise a second electrode 312 coupled to the second nanostructure 304. The second electrode 312 can be coupled to the first nanostructure 302 via a second wire 314. The second electrode 312 can comprise a conductive material, such as a metal.

In an aspect, the first nanostructure 302 and the second nanostructure 304 can be together configured to provide electrical energy. For example, the first nanostructure 302 and the second nanostructure 304 can be together configured to provide electrical energy via one or more of the first electrode 308 or the second electrode 312 in response to receiving thermal energy at the first nanostructure 302 and/or the second nanostructure 304.

The first nanostructure 302 can be disposed thermally in parallel to the second nanostructure 304. For example, the first nanostructure 302 and the second nanostructure 304 can each comprise a hot side 316. The hot side 316 can receive thermal energy (e.g., as heat). As the thermal energy is applied to the hot side 316, a current can be generated by the. The current and/or voltage can be generated in proportion to the amount of thermal energy (e.g., or heat) received on the hot side. The first nanostructure 302 and the second nanostructure 304 can each comprise a cold side 318.

In an aspect, the first nanostructure 302, the second nanostructure 304, and the electrical interconnect 306 can be arranged as a cell in an array of thermoelectric generating cells of a thermocouple. For example, the array of cells can be electrically coupled in series. The array of cells can be thermally in parallel. For example, the array of cells can have a common hot side for receiving thermal energy (e.g., heat).

Figure 4:
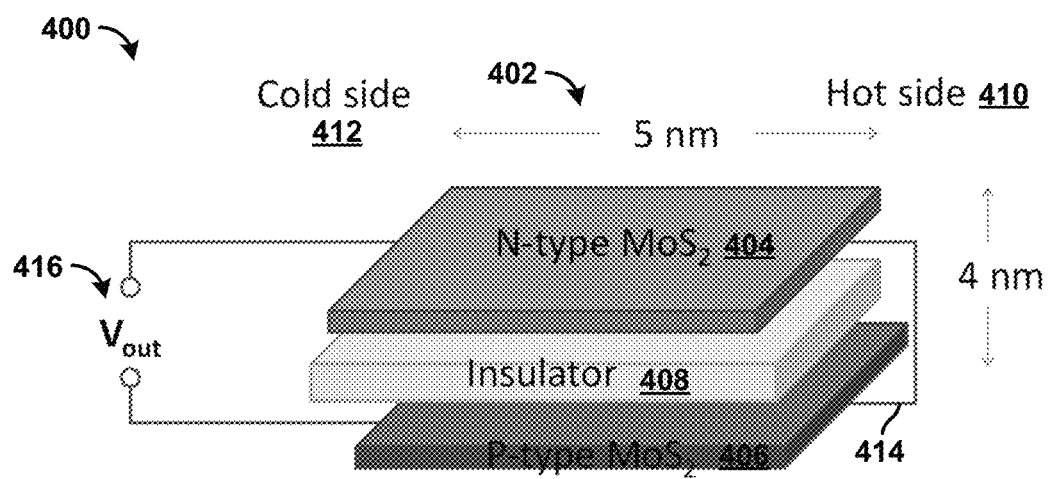
FIG. 4 illustrates another example device for generating electrical energy.

FIG. 4 illustrates another example device 400 for generating electrical energy. The device 400 can be an example embodiment of the device 400 of FIG. 3. The device 400 can comprise a main body 402. The main body 402 can comprise a n-type $MoS_2$ layer 404. The main body 402 can comprise a p-type $MoS_2$ layer 406. The n-type $MoS_2$ layer 404 can be separated from the p-type $MoS_2$ layer 406 by an insulator 408. The device 400 can comprise a hot side 410 and a cold side 412. The length of the main body 402 can be 5 nm. The height of the main body 402 can be 4 nm. These measurements are only used for the purposes of illustration and are not meant to be limiting. Those of ordinary skill in the art understand that the main body 402 may have a variety of different dimensions according to design requirements. The device 400 can comprise an electrical interconnect 414 configured to electrically couple the n-type $MoS_2$ layer 404 to the p-type $MoS_2$ layer. The electrical interconnect 414 can be disposed on the hot side of the device 400. The device 400 can comprise an electrical output 416.

Figure 5:
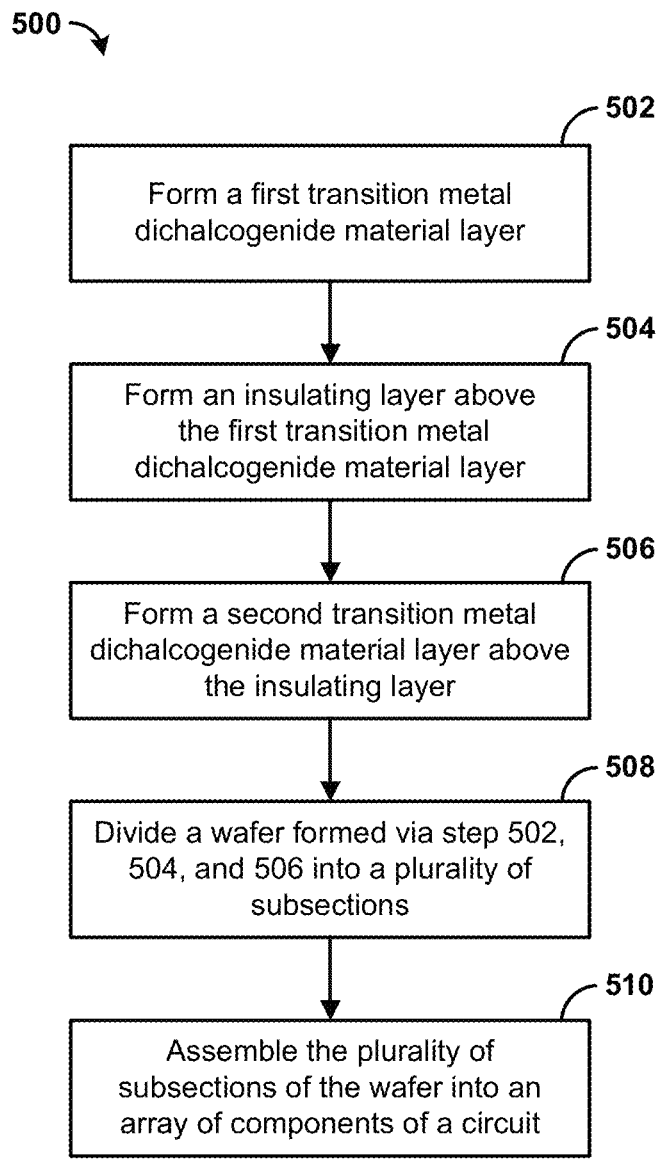
FIG. 5 is a flowchart illustrating an example method for fabricating an example device for generating electricity.

FIG. 5 is a flowchart illustrating an example method 500 for fabricating an example device for generating electricity. For example, the method 500 can be used to fabricate a thermoelectric generator as described herein. The method 500 can be used to fabricate the device 300 of FIG. 3. The method 500 can also be used to fabricate the device 400 of FIG. 4.

At step 502, a first transition metal dichalcogenide material layer can be formed. The first transition metal dichalcogenide material layer can be formed by a chemical vapor deposition, atomic layer deposition, epitaxial growth, mechanical exfoliation, and/or the like.

The first transition metal dichalcogenide material layer can be formed on (e.g. or above) a first insulating layer. In some scenarios the first insulating layer can be formed as part of a manufacturing process before the performing step 502. For example, the first insulating layer can be a prefabricated insulating layer, such as a substrate. The first insulating layer can comprise, for example, silicon dioxide.

The first transition metal dichalcogenide material layer can comprise a p-type or a n-type transition metal dichalcogenide material layer. The first transition metal dichalcogenide material layer can comprise molybdenum disulfide ($MoS_2$), tungsten sulfide (WS2), molybdenum diselenide (MoSe2), tungsten diselenide (WSe2), molybdenum ditelluride (MoTe2), a combination thereof, and/or the like.

At step 504, a second insulating layer can be formed on top (e.g., above) of the first transition metal dichalcogenide material layer. The second insulating layer can be formed by a chemical vapor deposition, atomic layer deposition, epitaxial growth, mechanical exfoliation, and/or the like. The second insulating layer comprise, for example, silicon dioxide.

At step 506, a second transition metal dichalcogenide material layer can be formed on top (e.g., or above) of the second insulating layer. The second transition metal dichalcogenide material layer can be formed by a chemical vapor deposition, atomic layer deposition, epitaxial growth, mechanical exfoliation, and/or the like.

The second transition metal dichalcogenide material layer can comprise a n-type or a p-type transition metal dichalcogenide material layer. The second transition metal dichalcogenide material layer can comprise molybdenum disulfide ($MoS_2$), tungsten sulfide ($WS_2$), molybdenum diselenide ($MoSe_2$), Tungsten diselenide ($WSe_2$), molybdenum ditelluride ($MoTe_2$), a combination thereof, and/or the like.

The first transition metal dichalcogenide material layer, the second transition metal dichalcogenide material layer, the first insulating layer, the second insulating layer, or a combination thereof can be formed as part of a wafer (e.g., or other structure). At step 508, the wafer can be divided into a plurality of subsections. For example, the wafer can be sliced, cut, and/or otherwise divided using a mechanical, lithographic, and/or chemical process.

At step 510, the plurality of subsections of the wafer can be assembled into an array of components of a circuit. The array of components of the circuit can comprise an array of thermoelectric generators configured to supply electrical current to the circuit in response to receiving thermal energy. For example, the array of the components can comprise one or more of the device 300 of FIG. 3. The array of the components can comprise one or more of the device 400 of FIG. 4.

Assembling the plurality of subsections of the wafer into an array of thermoelectric generators can comprise using a self-assembly process to form the array of thermoelectric generators. Self-assembly is a process in which components (e.g., a large quantity of small components) assemble themselves spontaneously via an interaction into an a large functional unit. Each of the plurality of subsections can comprise one or more components that (e.g., single thermoelectric generator) that assemble themselves into a large array of components (e.g., thermoelectric generators). As an example, assembling the plurality of subsections of the wafer into an array of thermoelectric generators can comprise assembling the subsections as a thin film.

Figure 6:
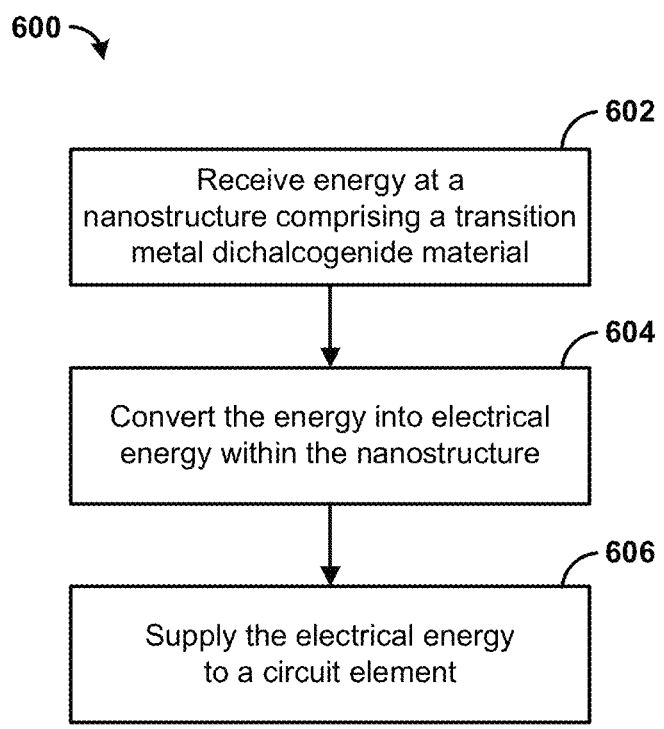
FIG. 6 is a flowchart illustrating an example method for operating an example device for generating electricity.

FIG. 6 is a flowchart illustrating an example method 600 for operating an example device for generating electricity. The device can comprise any of the devices disclosed herein (e.g., device 100, device 200, device 300, device 400). At step 602, energy can be received at a nanostructure comprising a transition metal dichalcogenide material. The nanostructure can comprise any layer, nanoribbon, and/or nanostructure described herein. The energy can comprise mechanical energy. For example, the transition metal dichalcogenide material can comprise the layer 102 of the device 100 of FIG. 1. The energy can comprise thermal energy. For example, transition metal dichalcogenide material can comprise the first nanostructure 302 and/or the second nanostructure 304 of the device 300 of FIG. 3.

At step 604, the energy can be converted into electrical energy within the nanostructure. For example, the energy can induce the electrical current within the nanostructure. At step 606, the electrical energy can be supplied to a circuit element.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to limit the scope of the methods and systems. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Example 1: Mechano-Electric Generators

The present disclosure comprises articles and compositions for electronic articles, such as wearable electronics, comprising two dimensional TMDC junction-based mechanical/electrical generators and sensors. Two-dimensional (2D) transition metal dichalcogenide (TMDC) mechano-electric generator were proven by comprehensive simulation using software from Virtual Nanolab ATK package authorized by Quantumwise Corporation. Disclosed herein are example mechano-electric generators comprising two dimensional (2D) TMDC PN junctions or heterojunctions, which may be in the form of nanoribbons. The 2D TMDC nanoribbons may be a monolayer or few-layer film, for example, 5 nm×1.5 nm in size. High output voltage of 0.036V and 0.310V can be achieved by using $MoS_2$ PN junction with 1% and 8% tensile strain, respectively, applied along transport direction. The high output voltage is attributed to the strong polarization of PN junctions or heterojunction. The output voltage of an example 2D TMDCs mechano-electric generator can have a variation of 19% induced by various widths. Examples show that the output voltage may slightly increase for longer length. The output voltage of an example 2D TMDC mechano-electric generator varies 3.7% for different doping positions. The output voltage is reduced by 21% for heavy doping concentration. Mechano-electric conversion by TMDCs heterojunction: (a) $WSe_2$—$MoS_2$ (b) $WSe_2$—$MoSe_2$ (c) $WS_2$—$MoS_2$ (d) $WS_2$—$MoSe_2$. The 2D nanoribbon is 5 nm×1.5 nm in size. The output voltage for these structures applied by 8% tensile strain are 0.185V, 0.00721V, 0.0855V and 0.0157V, respectively. The output voltage can be significantly improved by a series of connection. The comparison among various TMDCs PN junctions and heterojunctions: $MoS_2$, $WSe_2$, $MoSe_2$, $WS_2$ PN junction and $WSe_2$—$MoS_2$, $WSe_2$—$MoSe_2$, $WS_2$—$MoS_2$, $WS_2$—$MoSe_2$, indicated $WS_2$ PN junction possesses the highest output voltage of 0.356V whereas the $WS_2$—$MoS_2$ heterojunction has the lowest output of 0.00721V under 8% strain. Such mechanical/electrical generator and/or sensor may be made into articles that can be worn by humans, animals or inanimate objects, or may be incorporated into clothing or other types of covering articles. Generators disclosed herein may be power supply articles and may provide power for wearable electronics and on-body medical devices. The articles disclosed herein may be flexible, transparent and/or light weight.

The present disclosure describes methods and articles comprising two dimensional TMDC junction-based mechanical/electrical generators and sensors. Two-dimensional (2D) transition metal dichalcogenides (TMDs), such as isolated monolayers or few-layers of $MoS_2$ and $WSe_2$, have potential in future electronics. The bulk of TMDs usually have a layer structure which is similar to graphene. Because the layers are bound together by weak van der Waals forces, an isolated monolayer of TMDs can be easily obtained by cleaving technique. Unlike graphene, these 2D materials have a significant band gap and exhibit attractive semiconductor properties. Especially, TMD monolayers usually have a direct band gap, making them attractive for the mixed electronic and photonic application in future logic and memory devices.

The present disclosure describes methods and articles comprising the integration of these 2D materials into electronic devices, e.g., as the channel materials in MOSFETs, such as by lithography into nanoribbons, doped into n- or p-type, and stressed by the strain induced from the metal contacts and dielectric interface. The effects of these factors on the band structure and electrical properties of $MoS_2$ monolayers are disclosed herein and accomplished by using a numerical simulation method based on density functional theory. It was found that the doping, strain and size could induce significant variation in the electrical properties of these 2D materials. Disclosed is the size effect on the properties of $MoS_2$ monolayer nanoribbons. A band gap of $MoS_2$ nanoribbons changed from 1.8 eV of an infinite $MoS_2$ sheet to 1.2 eV of a 10×10 (in molecule) $MoS_2$ nanoribbons or 0.5 eV of a 5×10 $MoS_2$ nanoribbons was found. Also found was that the doping level and dopant position have a significant effect on the electrical properties of $MoS_2$ nanoribbons. The doping level and dopant position can induce large variation (e.g., 30%) in sheet resistance. This variation in electrical properties may pose a challenge for logic and memory devices.

In addition, the strain may affect the electrical and carrier transport properties of a $MoS_2$ monolayer. Under different strain, the $MoS_2$ monolayer will change from direct band-gap to indirect band-gap semiconductor. As the strain further increases to certain value, the $MoS_2$ monolayer may become metallic.

Transition metal dichalcogenides, such as $MoS_2$ and $WSe_2$, provide two-dimensional atomic crystals with semiconductor band gap. This disclosure describes mechano-electric generators and sensors based on $MoS_2$ nanoribbon PN junctions. The n- and p-type $MoS_2$ regions can be realized by substituting S atoms with Cl and P atoms, respectively. The mechano-electric conversion can be simulated by using first-principle calculation. The output voltage increased with strain, reaching 0.31V with 8% strain. It was found that the conversion from mechanical stress to electrical voltage arose from the change in junction polarization and the separation of localized charges around the atoms. The effect of nanoribbon width and the mechano-electric conversion of $MoS_2$—$WSe_2$ heterojunctions are also described. Such mechano-electric generators and sensors based on two-dimensional semiconductors are very attractive for applications in future self-powered electronics and carry-on electronic systems.

Mechanical energy is one of the most ubiquitous energy sources in the environments and is readily accessible from the human activities. Therefore, the conversion of mechanical energy into electricity offers an immediate, stand-alone power support for remote control, wearable electronics, wireless sensing and remote battery charging. A piezoelectric transducer is the most distinguished technique for harvesting vibration based energy by its high practical output power and relatively easier manufacturing. Recently, the piezoelectric properties of nanowires have been widely studied for potential applications in sensors, transducers, energy conversion and electronics. The coupling of semiconductivity and piezoelectricity in one-dimensional (1D) ZnO nanowires (NWs) in an electric generator has been studied, which demonstrated an excellent power conversion with efficiency estimated from 17% to 30%. However, the naturally parallel alignment of 1D ZnO NWs may hinder high-performance applications in Nanoelectromechanical Systems (NEMS). Two-dimensional (2D) layered materials, such as hexagonal boron nitride (h-BN) and transition metal dichalcogenides (TMDCs), can be advantageous for their capability of utilizing or assisting body movement, muscle stretching and blood vessel contraction. 2D $MoS_2$ monolayer, a typical member of TMDCs, become noncentrosymmetric in exfoliation from its bulk crystal by breaking the inversion symmetry. This transition achieves valley polarization by valley-selective circular dichroism and therefore attracts potential applications in valleytronic devices.

The piezoelectricity, mechanical energy harvesting and piezotronic sensing in single-layer $MoS_2$ have recently been explored experimentally. Angular dependence of piezoelectricity has been measured by optical second-harmonic generation (SHG), indicating that the strongest ionic polarization occurs along armchair direction and completely vanishes along zigzag direction. An open-circuit voltage of 18 mV has been demonstrated in a single-layer device with a large dimension of 10 μm in length and 5 μm in width under 0.53% strain along armchair direction. This output voltage is still quite small. Enhancement of output performance is needed for further application of 2D materials in mechanical-to-electric generators. In this example, a novel mechano-electric conversion device based on a $MoS_2$ nanoribbon PN junction (e.g., 5 nm in length and 1.5 nm in width) is disclosed. First-principle calculation has shown that a high output voltage 0.036V and 0.31 V was achieved by 1% and 8% strain, respectively. In consideration of the small size of nanoribbon, this mechano-electric generator has high conversion efficiency and its performance can be improved significantly by a series of connection. This data suggested that piezoelectricity can be strongly enhanced by PN junction in $MoS_2$ monolayer, providing significant guidance for future research in 2D TMDCs based nano-power generator.

This example presents the piezoelectric transmission of $MoS_2$ nanoribbon based PN junction by atomic doping. FIG. 7A illustrates an example convenient carry-on mechano-electric generator based on 2D semiconductors for energy harvest from muscle stretching. Its electromechanical conversion process was simulated by first principle calculations carried out by the density functional theory (DFT) in Virtual Nanolab ATK package. The Localized Density Approximation (LDA) exchange correlation with a Double Zeta Polarized (DZP) basis was used with a mesh cut-off energy of 150 Ry. Used was a 1×1×50 Monkhorst-Pack k-grid mesh in this simulation with more k-points in transport direction. All atomic positions and lattice constants were optimized by using the Generalized Gradient Approximations (GGA) with the maximum Hellmann-Feynman forces of 0.05 eV/Å. The Pulay-mixer algorithm was employed as iteration control parameter with tolerance value of 10-5. The maximum number of fully self-consistent field (SCF) iteration steps was set to 1000. The temperature was set to 300K (Room temperature) for all the simulations. The self-consistent field calculations were checked strictly to guarantee fully converging of the iteration steps.

Figure 7B:
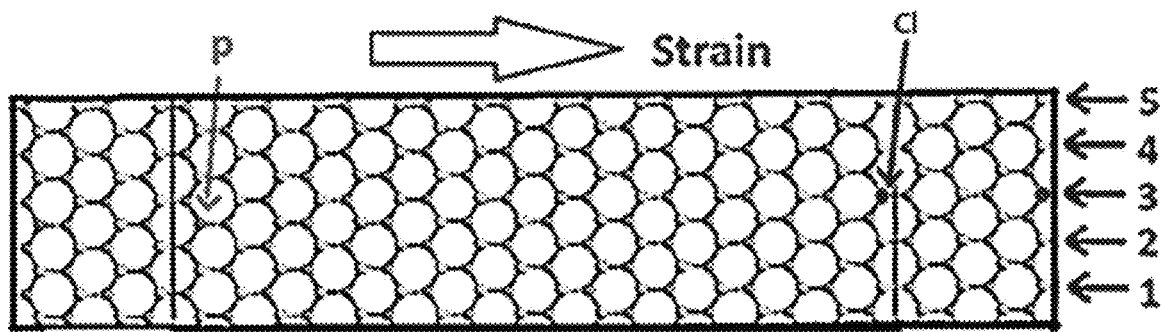
FIG. 7B illustrates a configuration of an example mechano-electrical generating device.
Figure 7C:
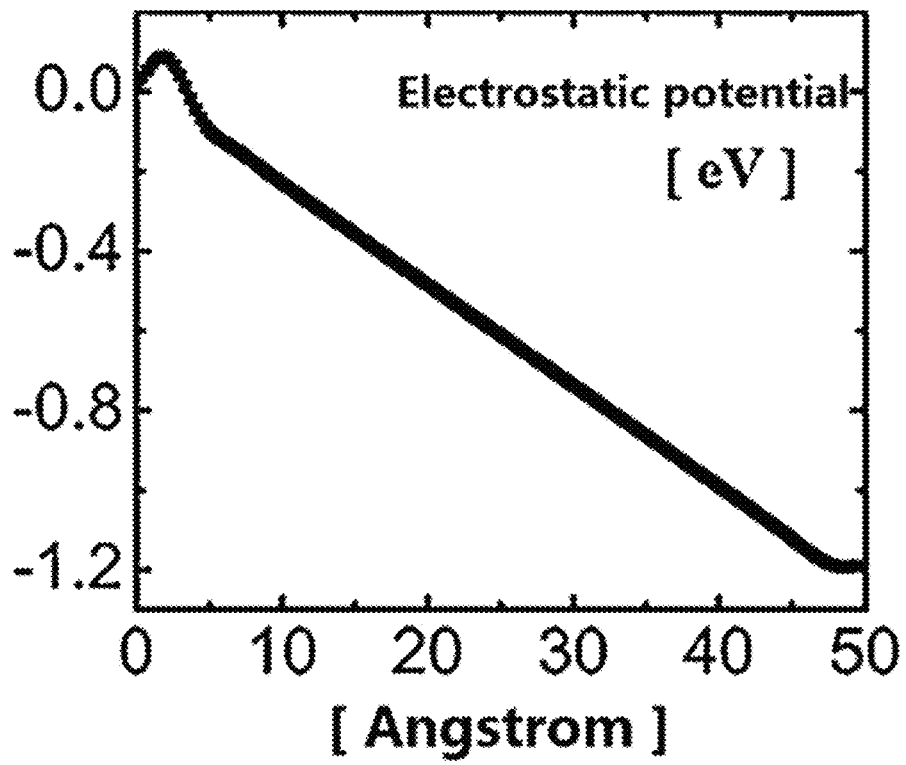
FIG. 7C illustrates the electrostatic potential as a function of position.

In order to methodically illustrate the simulations of the designed model, the report was organized systematically as rigorous steps: First, the intrinsic piezoelectricity of two-dimensional (2D) infinite $MoS_2$ monolayer was shown. Second, the output performance of the device was illustrated. Next shown was the localized charge can be redistributed by the external strain. The charge separation and moving process were revealed and the underlying physical explanation was indicated. In addition, the width-dependent output was investigated. Finally, the $WSe_2$—$MoS_2$ heterojunction based mechano-electric generator was demonstrated. The data suggested that the device can serve as effective mechano-electric conversion device and was applicable in industrial NEMS production. FIG. 7A illustrates carry-on electronics with mechano-electric generator based on 2D semiconductors. FIG. 7B illustrates a configuration of an example mechano-electrical generating device. The left and right rectangles represent the left and right electrode. FIG. 7C illustrates the electrostatic potential as a function of position in the center region under zero strain.

As shown in FIG. 7B, an example device can comprise three regions: left electrode, right electrode, and central region. The central scattering region comprised 5×9 unit cells: the width was composed of 5 periodic unit cells in zigzag direction and 9 lattice basic lengths were included in armchair direction, which was designed as transport direction in this example. In the transport direction Dirichlet boundary condition was applied on the two opposite electrodes, in which the electric potential was fixed. Neumann condition was employed on the other two directions, in which the electric field was held homogeneously at the boundary. $MoS_2$ nanoribbon exhibited intrinsic semiconductivity and strongest piezoelectricity along the armchair direction while metallicity and high crystal inversion symmetry were demonstrated in zigzag direction. The coupled piezoelectricity and semiconductivity were expected for the creation of charge separation under strain along armchair direction. Substituting sulfur (S) by chlorine (Cl) shifted the Fermi level towards conduction bands, resulting in n-type doping while the inverse p-type doping is realized by the replacement of phosphorus (P). The impurity density on both sides was chosen to be 1013 $cm^{-2}$ within reasonable computational burden. FIG. 7C displays the electrostatic potential as a function of position in the unstrained central region. As shown, it was decreasing monotonically along the transport direction and the electrostatic potential dropping (EPD) was 1.19 eV at right edge with respect to the left counterpart. This was consistent with the design that p-type was realized at the left side while the right side was n-type.

Figure 8:
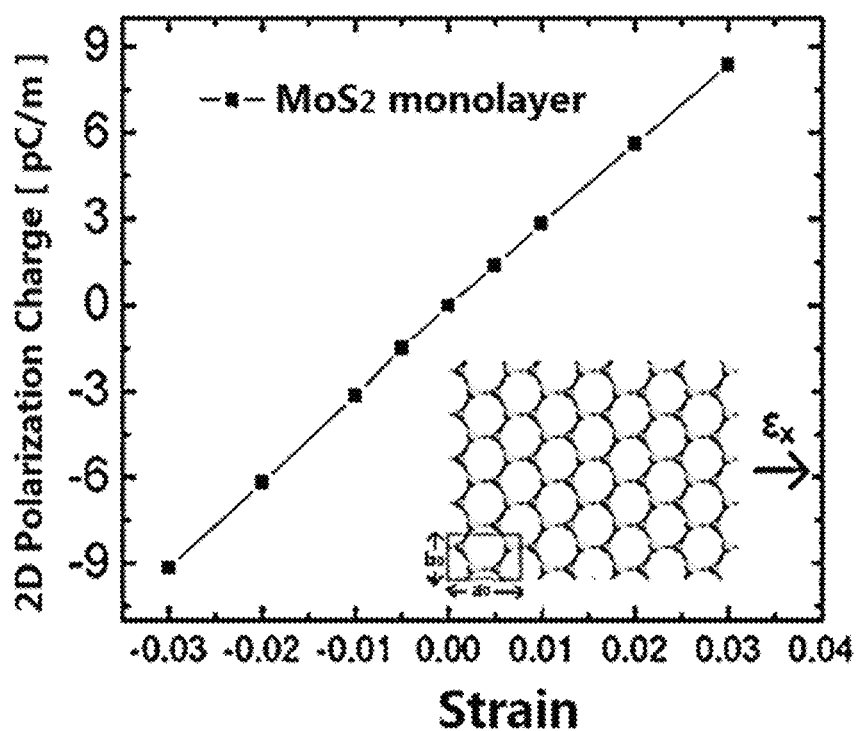
FIG. 8 is a graph illustrating example polarization charge as the function of strain along in-plane armchair direction for undoped two dimensional infinite $MoS_2$ monolayer.

FIG. 8 is a graph illustrating example polarization charge as the function of strain along in-plane armchair direction for undoped two dimensional infinite $MoS_2$ monolayer. The inset of FIG. 8 illustrates the atomic structure of $MoS_2$ monolayer. The strain was applied along armchair direction.

Firstly, the intrinsic piezoelectricity of $MoS_2$ monolayer was investigated. Noncentrosymmetric lattice structure was necessary for a material to be piezoelectric. The three-dimensional (3D) bulk stacked-layer h-BN and 2H-TMDC crystals were centrosymmetric due to their experimentally observed antiparallel stacking sequence. However, the two dimensional (2D) monolayer of TMDCs, such as $MoS_2$, $WSe_2$, $WS_2$, $MoSe_2$, etc., which can be fabricated by exfoliation from their 3D bulk materials, exhibits noncentrosymmetric crystal structure. This noncentrosymmetry stemmed from the particular dislocated stacks of the different layers composed by chalcogen atoms and transition elements and accordingly resulted in the absence of inversion center. As a typical member of TMDCs, 2D $MoS_2$ monolayer is naturally piezoelectric. FIG. 8 shows its polarization charge as the function of strain applied along in-plane armchair direction. In this example, the strain was evaluated as the lattice changing percentage. Defined was $\varepsilon x \equiv \Delta a0/a0$, where $\Delta a0$ is the increase of lattice constant a0 due to the strain. The coefficient e11, defined as the slope of linear fit line for charge vs. strain relation, revealed the change in polarization along armchair direction per unit cell by strain. The estimation of e11 is 2.98×10-10 C/m, which was very close to the experimentally reported 2.90×10-10 C/m (22).

Figure 9A:
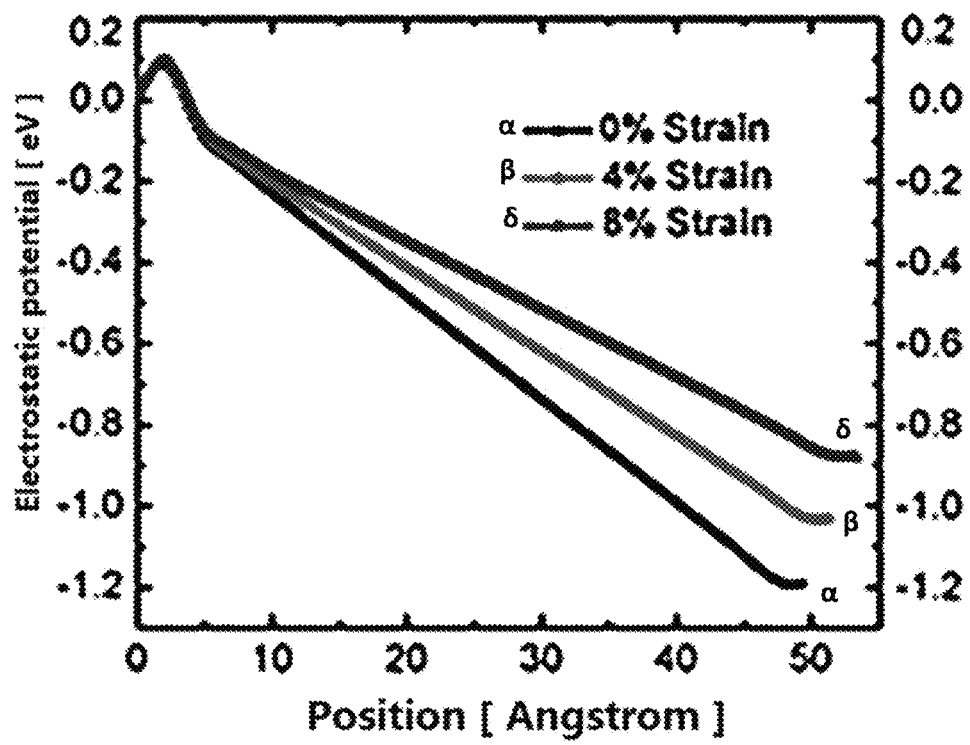
FIG. 9A is a graph illustrating a 0%, 4%, and 8% tensile strain modulated electrostatic potential along transport direction in the center region of an example device.
Figure 9B:
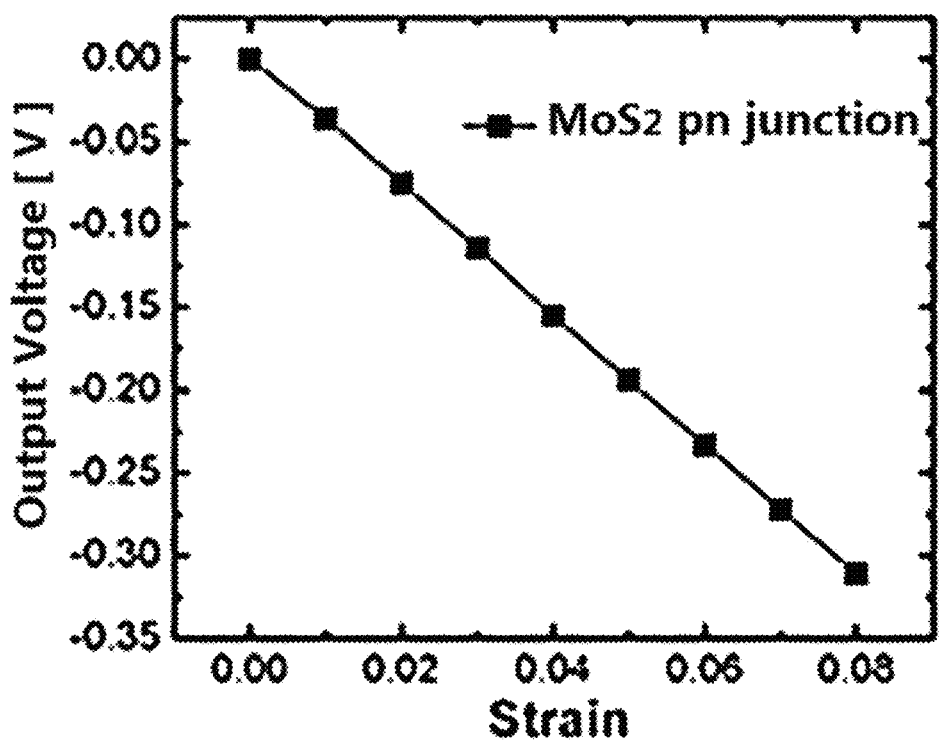
FIG. 9B is a graph illustrating example output voltage as a function of strain.
Figure 9C:
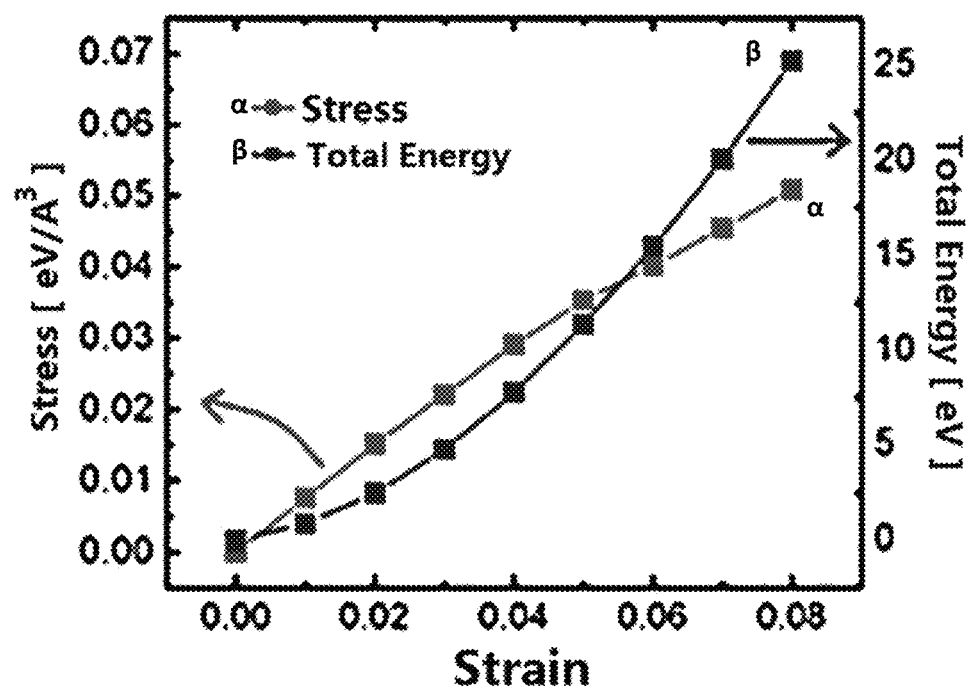
FIG. 9C is a graph illustrating the stress and total energy of the center region of an example device as a function of strain.
Figure 9D:
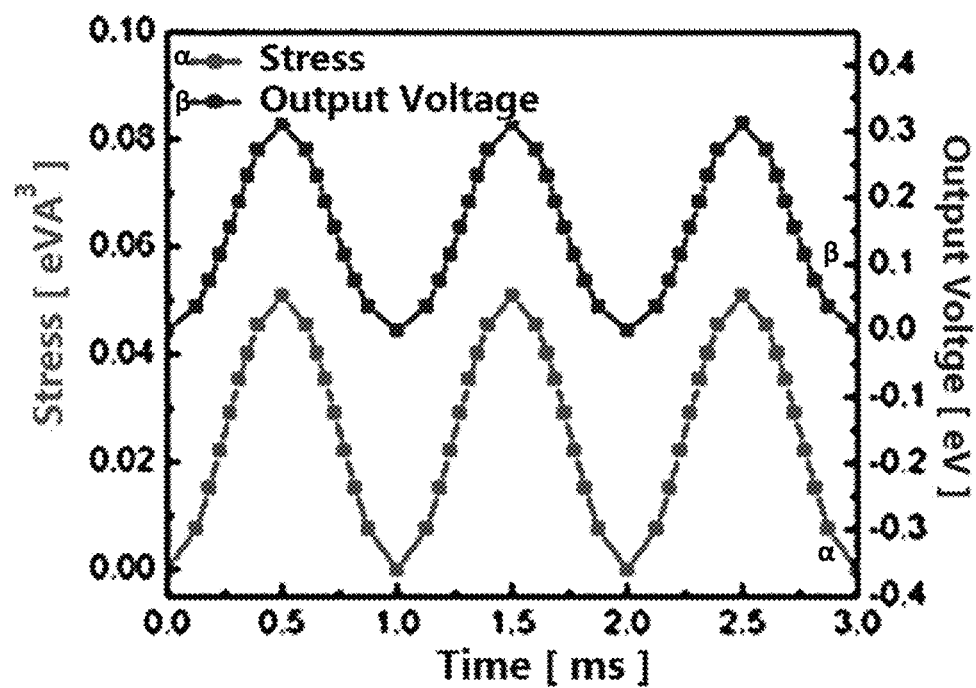
FIG. 9D is a graph illustrating stress in sine waveform-time domain is laterally applied on the device.

FIG. 9A is a graph illustrating a 0%, 4%, and 8% tensile strain modulated electrostatic potential along transport direction in the center region. FIG. 9B is a graph illustrating example output voltage as a function of strain. The negative value in the study denotes the electrical potential in left electrode is higher than right electrode. FIG. 9C is a graph illustrating the stress and total energy of the center region of the model as a function of strain. FIG. 9D is a graph illustrating stress in sine waveform-time domain is laterally applied on the device. Darker line: the output voltage response.

Secondly, the electronic property of the model under lateral strain was simulated. The strain given by ε=(L–L0)/L0 was initially applied along transport direction, where L0 and L is the equilibrium length along the transport direction of the unstrained and strained device, respectively. FIG. 9A revealed the electrostatic potential distribution along transport direction in the center region for the device applied by 0%, 4% and 8% tensile strain, respectively. The center region was extended from 49.2 Å to 53.2 Å in length by 8% strain. As shown the structure under 8% strain has the smallest EPD. EPD reduces from 1.19V for unstrained structure to 0.878V for the structure under 8% strain. FIG. 9B demonstrated the output voltage as a function of strain applied along the transport direction. The absolute value of output voltage was linearly increasing by larger strain. The maximum output voltage was 0.31V in the case of 8% strain. The negative value denoted that the electrical potential at left electrode is higher than that of right electrode and therefore the left side served as the anode while the right counterpart was the cathode in the device. This data suggested a highly efficient nano-generator, which has 20 mV output in small size (5 nm) under 0.5% strain. This indicated significantly enhanced performance by doping and PN junction based device over undoped $MoS_2$ nanosheet. This improvement in output was attributed to the strongly enhanced polarization between bipolar atoms induced by the coupled built-in electric field and external strain.

Next investigated was the mechanical property of the device based on PN junction. FIG. 9C demonstrates the variation of total energy with uniaxial strain applied along transport direction. The total energy (Etotal) was increasing monotonically as the increasing strain (ε). The slope of this curved line by the expression of dEtotal/dε was also rising by the increasing strain. The evolution of the stress with strain was estimated by the mathematic expression: σ=1/(V)dEtotal/dε, where V is the volume of the system. The orthorhombic cube with 9.6 $nm^3$ of the total volume was sampled in the example. The stress required for deformation intensity denoted by strain ε was increasing monotonically with the larger strain. The stress vs. strain relation had good linearity within the small strain range 0≤ε≤3% and the elastic modulus C was keeping constant by the expression C=dσ/dε. A previous report indicated that this parameter can remain constant within small strain (–2%≤ε≤2%) for $MoS_2$ monolayer. For the larger strain from 4% up to 8%, this relation slightly deviated from linearity and accordingly reduces the elastic modulus C. FIG. 9D showed the output voltage response for the device under laterally applied stress in Sine waveform-time domain. The periodic time of the dynamic stress is 1 ms. Therefore a proper assumption can be suggested that there is negligible delay between input force and output voltage phase. As shown the maximum output voltage ~0.31V can be achieved.

Figure 10A:
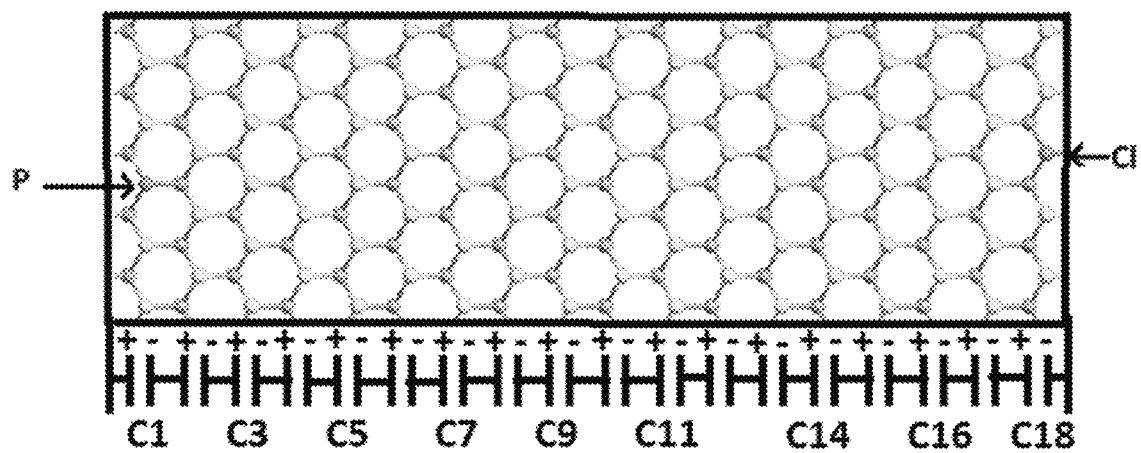
FIG. 10A illustrates an example configuration of a central region of an example device.
Figure 10B:
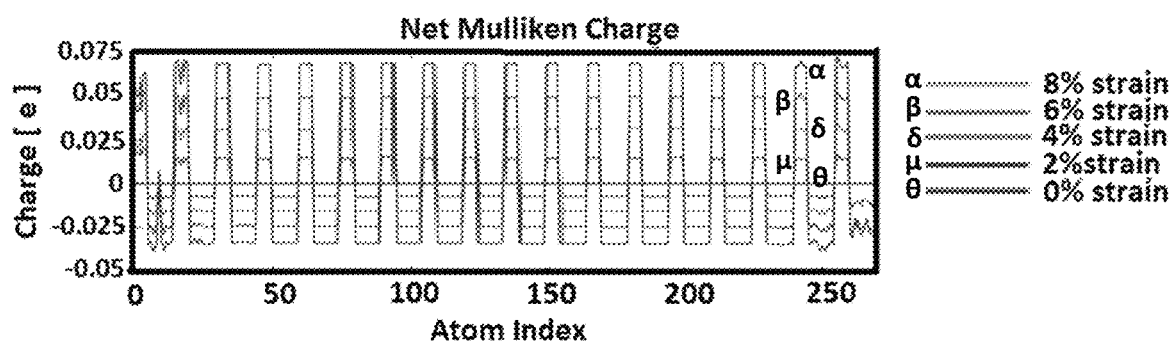
FIG. 10B is a graph illustrating the net mulliken charge as a function of atomic position in the central region.
Figure 10C:
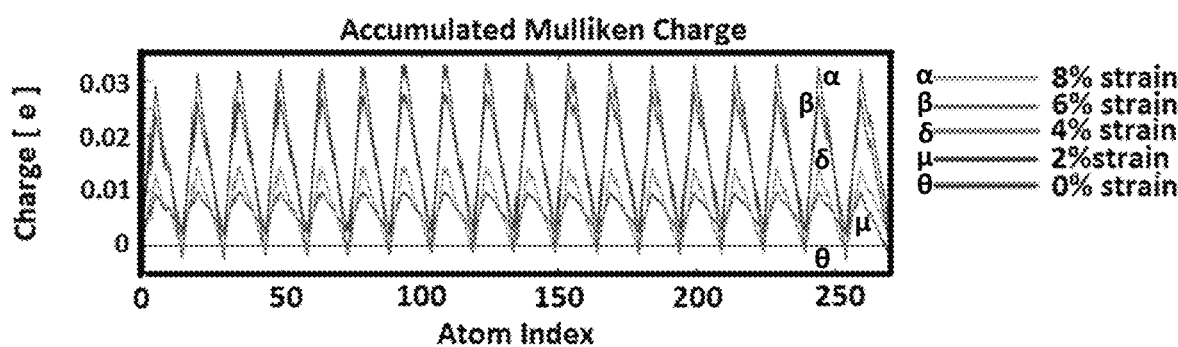
FIG. 10C is a graph illustrating the accumulated mulliken charge as a function of atomic position in the central region.

The underlying physical principle on strain induced output voltage was explored. The charge transfer and redistribution in the center region induced by strain is illustrated by FIG. 10A through FIG. 10C. FIG. 10B shows the strain induced localized charge (Mulliken Charge) occupied by each atom as a function of atomically ordinal number, which was increasing gradually from the left side to right side. The atomically localized charges for all the atoms in unstrained structure are set to 0. As displayed the strain can enhance the polarization between atoms with opposite polarity. Molybdenum possesses more positive charge while sulfur becomes more negative in the structure under strain. Therefore 18 capacitors were created in the central region, as denoted by C1 to C18 in FIG. 10A.

FIG. 10A illustrates an example configuration of a central region of our model. Charge polarization induced by strain creates 18 capacitors in this region as denoted by C1 to C18. FIG. 10B is a graph illustrating the net mulliken charge as a function of atomic position in the central region. FIG. 10C is a graph illustrating the accumulated mulliken charge as a function of atomic position in the central region.

FIG. 10C reveals the accumulated charge vs. atomically ordinal number by the integration of charge value of each atom from left to right side in FIG. 10B. The accumulated charge was keeping positively in this integration, indicating that generally the positive charge moved toward p-type side while negative charge transferred to n-type side by tensile strain. The built-in electrical field with the direction from n-type side to p-type side drives the opposite charge separately. The electrical field created by these polarized charges orientated inversely to the built-in electrical field. This compromise effect gave rise to the reduced EPD by strain. It should be noted that the localized charges dominate the charge transfer process. Because of the high impurity doping density ~$10^{13}$ $cm^{-2}$ and the small size of the device, the free charge carriers were strongly depleted and play insignificant role in the generation of output voltage. Piezoelectric potential can be partially screened by the free charges and thus the depleted system preserves the piezoelectricity. Relative dielectric constant (εr) of $MoS_2$ monolayer can be deduced by the model:

$$C \times U_o/N = Q_c$$

where N=18, denotes the number of capacitors. C=εr×ε0×S/d, reflects the capacitance of each small capacitor. ε0=8.854×10-12 F/m, is the dielectric constant for vacuum. S is the area of cross section vertical to the transport direction in our device and d is the distance between the opposite capacitor plates. In our study, S=1.58×0.317 $nm^2$, d=0.091 nm. Qc indicates the electrical charge of each capacitor. As displayed in FIG. 10C, the value Qc≈0.035e. Uo denotes the output voltage of the device, which is 0.31 V for 8% strain. Thus:

$$\varepsilon_r = \frac{N \cdot Q_c \cdot d}{U_o \cdot \varepsilon_0 \cdot S},$$

The achieved relative dielectric constant was 6.7, which was very close to the previously reported 6.8-7.3 for $MoS_2$ monolayer.

Figure 11A:
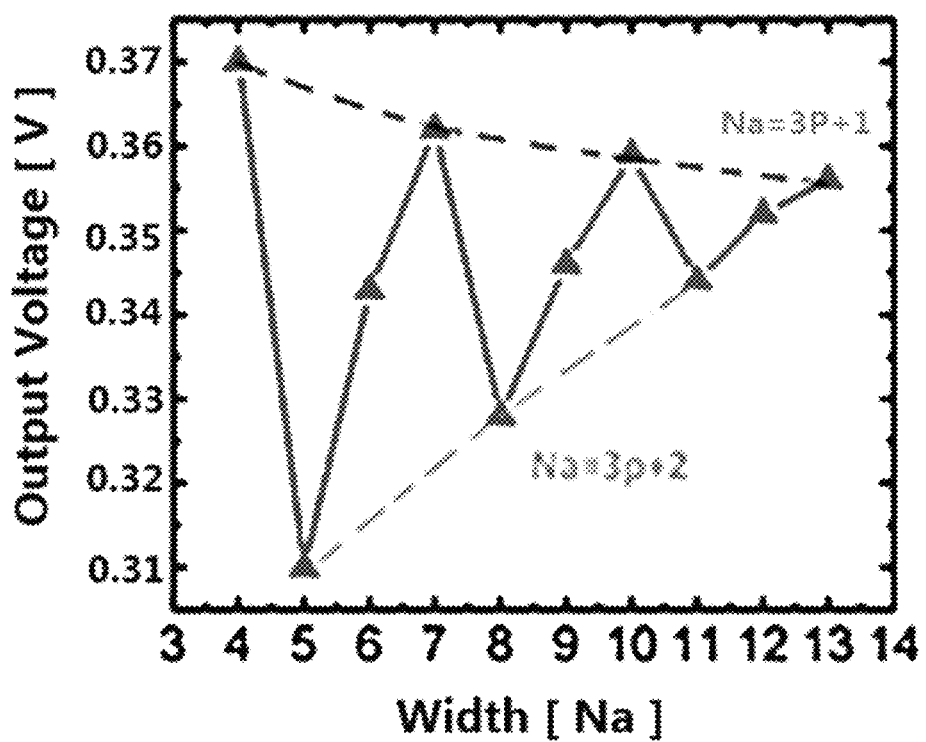
FIG. 11A is a graph illustrating example evolution of output voltage with $MoS_2$ nanoribbon width.
Figure 11B:
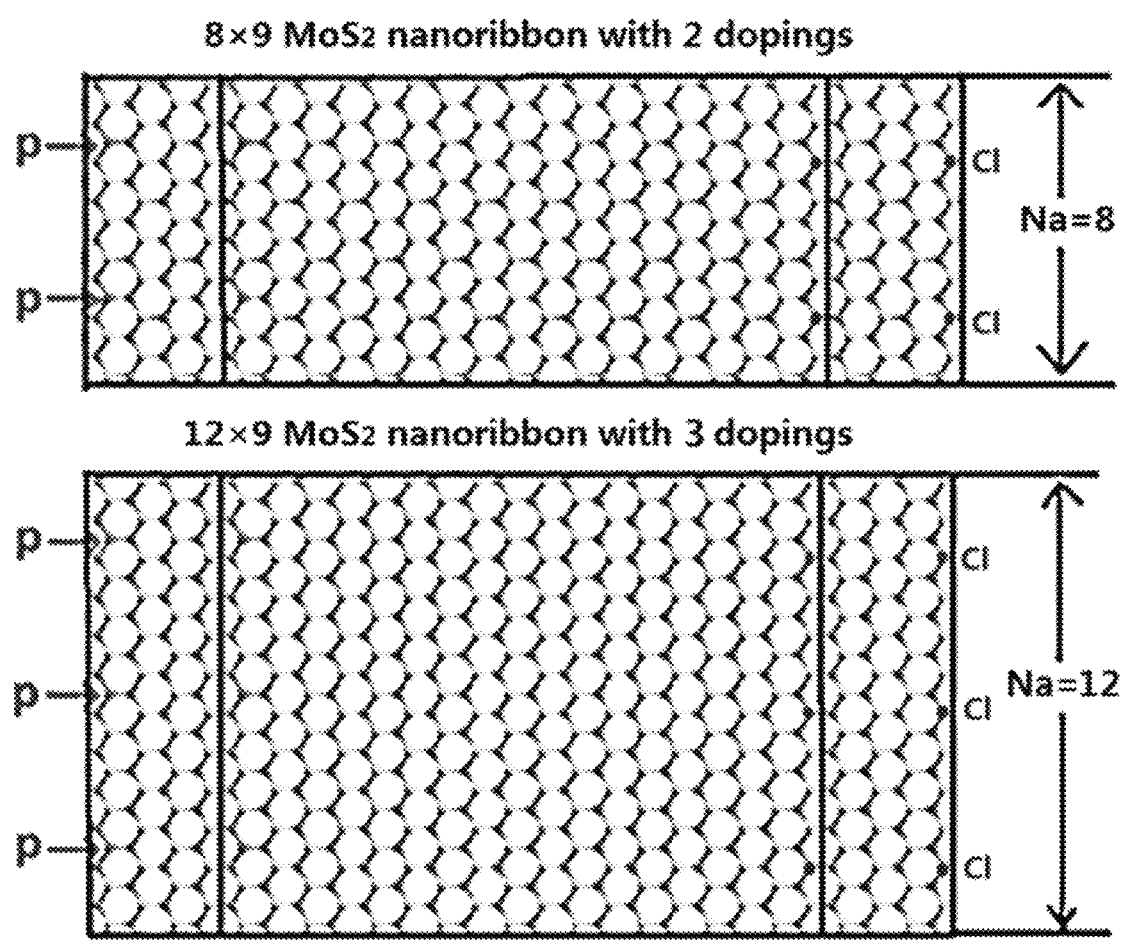
FIG. 11B illustrates a configuration of a nanoribbon with various widths.

FIG. 11A is a graph illustrating example evolution of output voltage with $MoS_2$ nanoribbon width. All the structures are keeping one doping atom at each side. FIG. 11B illustrates a configuration of a nanoribbon with width (Na=8, Na=12) by 2 doping and 3 doping atoms, respectively.

The evolution of the output voltage with nanoribbon width (Na) was also investigated. The nanoribbon width is denoted by periodical number of unit cells in zigzag direction vertical to the transport direction. For each structure with incremental width, one doping atom was kept at the center of lateral edge. The length of nanoribbon was kept 9 periodic unit cells in transport direction. As displayed in FIG. 11A, the output voltage oscillations are observed for the narrow ribbons, and those nanoribbons of Na=3p+1 (where p is an integer) have larger output than the neighboring two nanoribbons. With increasing width, the output voltage finally converges to a constant value ~0.355 V. The enlarged size will attenuate the doping concentration, and might lead to unexpected impact on the performance of our device. To clarify this issue, two pairs of phosphorus and chlorine doping atoms were introduced in 8-width structure (e.g., FIG. 11B), and also, three pairs of doping atoms were introduced in 12-width nanoribbon (e.g., FIG. 11C). The doping concentration of these structures were kept the same as 4-width structure with one pair of doping atoms. The output voltage for these two structures are 0.328 V and 0.346 V, indicating slight difference with one doping structure of 8-width (0.328V) and 12-width (0.352V), respectively. The data suggested a mechano-electric generator with weak dependence on width and doping concentration, which is a favorable aspect for industrial application.

Figure 12A:
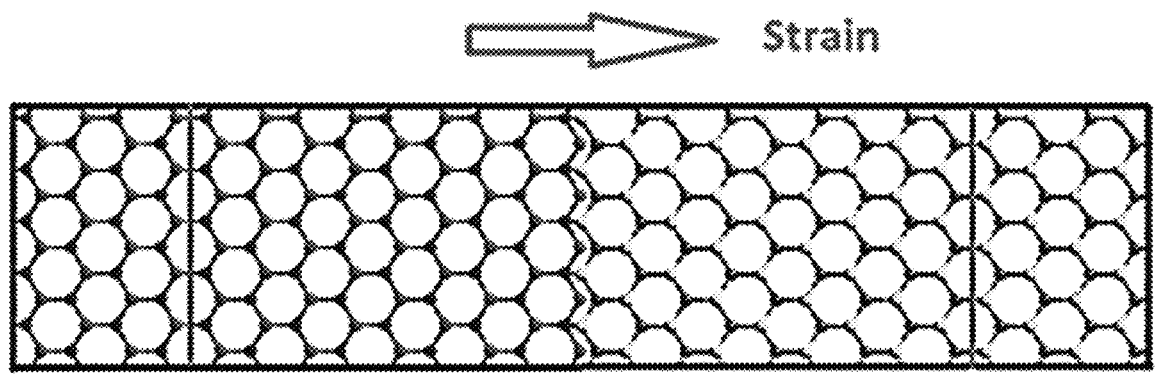
FIG. 12A illustrates an example configuration of a nano-power generator comprising a heterojunction.
Figure 12B:
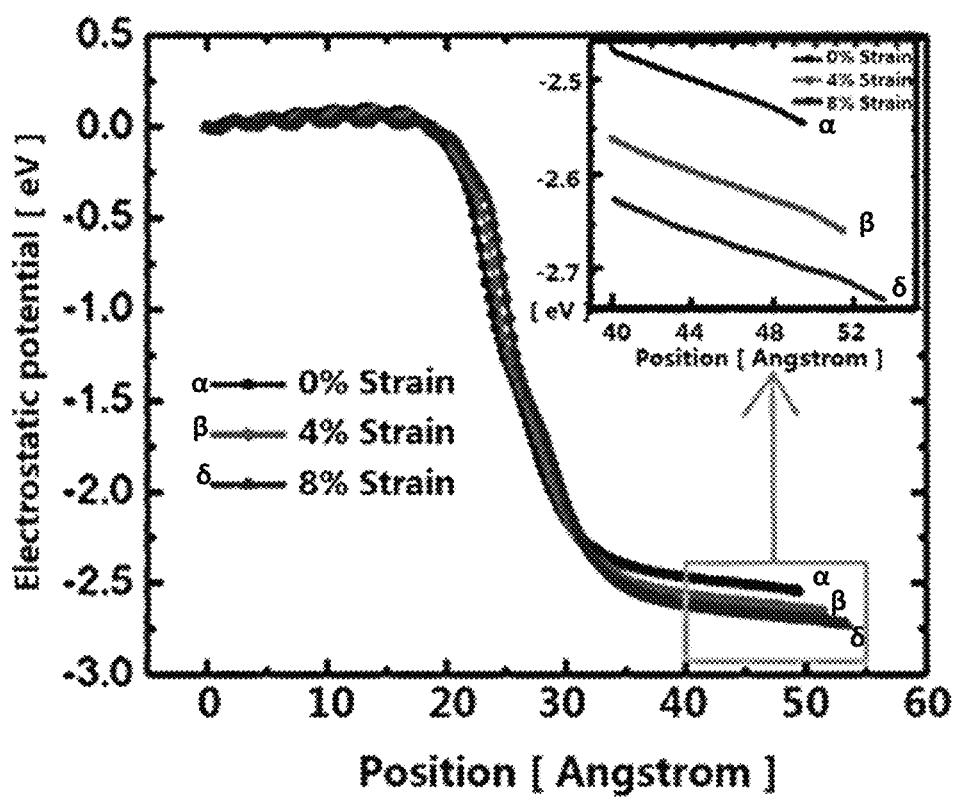
FIG. 12B is a graph illustrating tensile strain modulated electrostatic potential along transport direction in the center region for an example device.
Figure 12C:
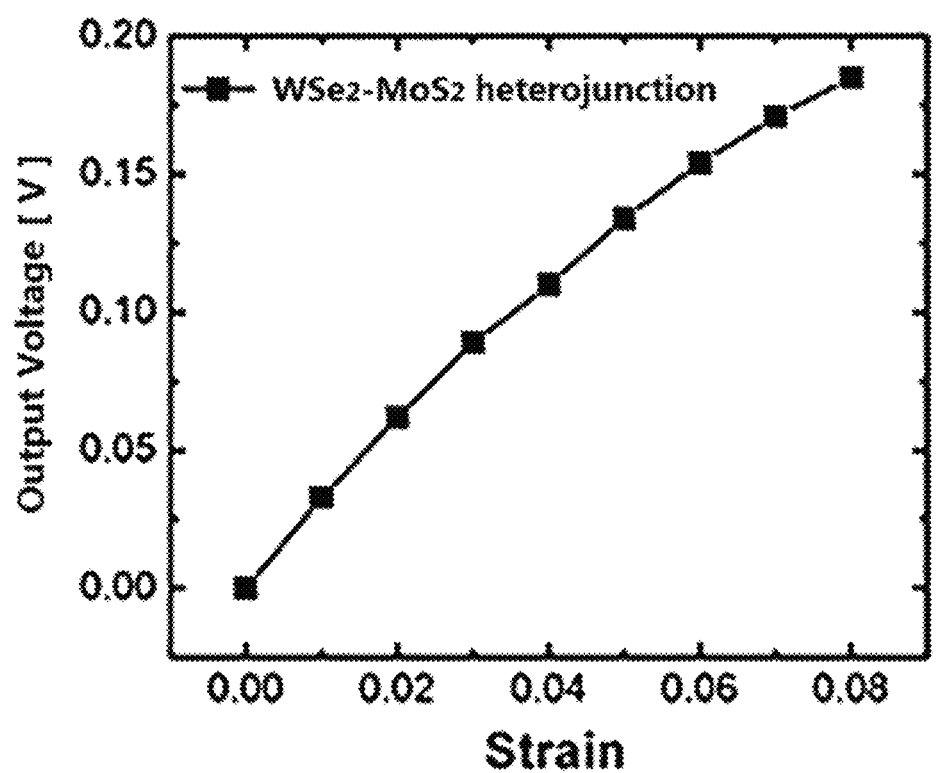
FIG. 12C is a graph illustrating the evolution of the output voltage with strain.

FIG. 12A illustrates an example configuration of a nano-power generator based on $WSe_2$ and $MoS_2$ heterojunction. The left part comprises $WSe_2$ and the right part comprises $MoS_2$. FIG. 12B is a graph illustrating 0%, 4%, and 8% tensile strain modulated electrostatic potential along transport direction in the center region for device displayed in FIG. 12A. The inset of FIG. 12B shows an enlarged view of electrostatic potential within the region from 40 Å to 55 Å. FIG. 12C is a graph illustrating the evolution of the output voltage with strain.

The $WSe_2$—$MoS_2$ heterojunction based mechano-electric generator was displayed in FIG. 12A. The left part is $WSe_2$ nanoribbon and the right counterpart is $MoS_2$ nanoribbon. FIG. 12B reveals the electrostatic potential distribution along transport direction in the center region for the device under 0%, 4% and 8% tensile strain, respectively. The EPD mainly occurred at the narrow connection region between $WSe_2$ and $MoS_2$ nanoribbon. This change in electrostatic potential arises from the difference between the working functions of $WSe_2$ and $MoS_2$ monolayer. As opposite to the change regulation of EPD by strain in $MoS_2$ PN junction, increasing strain can lead to larger EPD in heterojunction. FIG. 12C reveals the output performance as a function of strain. The output voltage increased with larger strain and 0.185 V can be achieved by 8% strain. The data suggested that $MoS_2$ PN junction based device has better output performance than TMDCs based heterojunction.

In summary, enlightened by the intrinsic piezoelectricity of TMDCs based two dimensional monolayer, disclosed and simulated herein was a novel piezoelectric device realized by $MoS_2$ monolayer based PN junction. Its electromechanical property was simulated by first-principle calculations. 0.31 V of output voltage can be achieved by 0.051 eV/A3 of the laterally tensile stress, which leads to 8% strain in transport direction. The time domain-output voltage in the case of the applied stress in Sine waveform was demonstrated. The plot of charge distributions vs. position in the central region indicated that the output voltage was attributed to the enhanced polarization and separation of atomically localized charges induced by the coupled built-in electric field and the tensile strain. The relative dielectric constant ~6.7 for $MoS_2$ monolayer was deduced by our model. The investigation on width-dependent performance demonstrated that the increasing width will finally converge to constant output ~0.355 V. The piezoelectric performance based on $WSe_2$—$MoS_2$ heterojunction was also simulated and 8% strain can induce output voltage of 0.185 V. The data suggested a novel $MoS_2$ PN junction based mechano-electric generator with high performance and provides physical insight into its working principle. There are many applications for a 2D-TMDCs based piezoelectric transistor.

Example 2: $MoS_2$ Nanoribbons Thermoelectric Generators

In this example, a thermoelectric generator based on monolayer and few-layer $MoS_2$ nanoribbons is disclosed. The thermoelectric generator was composed of thermocouples made of both n-type and p-type $MoS_2$ nanoribbon legs. Density functional tight-binding non-equilibrium Green's function (DFTB-NEGF) method was used to calculate the transmission spectrums of $MoS_2$ armchair and zigzag nanoribbons. Phonon transmission spectrums were calculated based on parameterization of Stillinger-Weber potential. Thermoelectric figure of merit, ZT, was calculated using these electronic and phonon transmission spectrums. Monolayer and bilayer $MoS_2$ armchair nanoribbons were found to have the highest ZT value for p-type and n-type legs, respectively. Moreover, the thermoelectric current of doped monolayer $MoS_2$ armchair nanoribbons and Si thin films were compared. Results indicated that thermoelectric current of $MoS_2$ monolayer nanoribbons was several orders of magnitude higher than that of Si thin films.

The advent of Graphene, a two-dimensional (2D) sheet of carbon atoms in honeycomb lattice, has stimulated great interest and intensive research on the properties of 2D materials. More recently, a new family of 2D semiconductor materials has been proposed, namely Transition Metal Dichalcogenides (TMDs). The presence of a bandgap in TMDs, a crucial property for microelectronics applications, has attracted much attention in comparison with the gapless Graphene. Among all TMDs, Molybdenum disulfide ($MoS_2$) is the most representative, widely interesting and intensively studied one, partially because it is relatively stable and readily available. $MoS_2$ has been used as a dry lubricant in automobile industry due to its low friction properties. Recently, it has been studied for applications in field effect transistors, photovoltaics and photocatalysis.

Figure 13A:
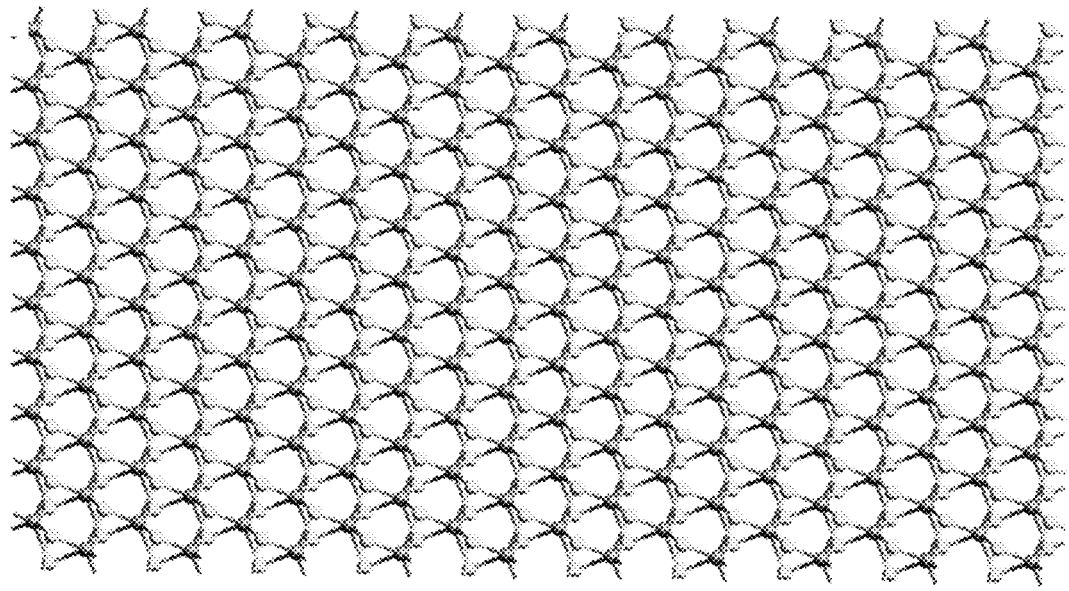
FIG. 13A illustrates a monolayer of $MoS_2$.
Figure 13B:
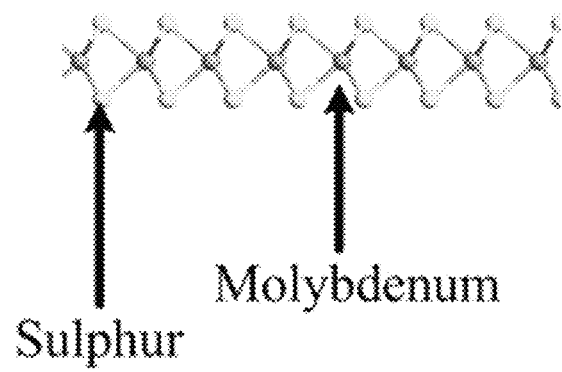
FIG. 13B is a side-view illustrating a monolayer nanostructure.
Figure 13C:
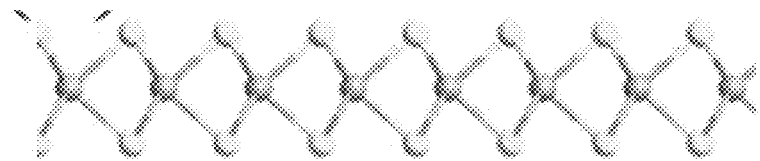
FIG. 13C is a side-view illustrating an example bi-layer nanostructure.
Figure 13C:
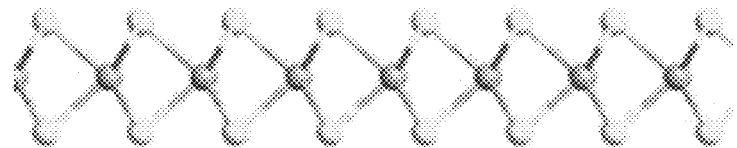
Figure 13D:
FIG. 13D is a side-view illustrating an example tri-layer nanostructure.
Figure 13D:
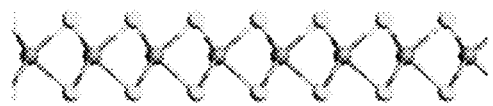
Figure 13D:
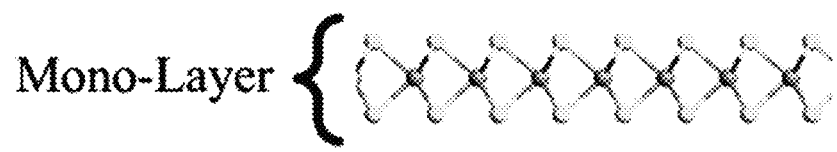
Figure 13E:
FIG. 13E is a side-view illustrating an example quad-layer nanostructure.
Figure 13E:
Figure 13E:
Figure 13E:

In general, bulk TMDs has a layered structure. Each layer is formed by a plane of transition metal atoms sandwiched between two planes of chalcogen atoms in trigonal prismatic arrangements as illustrated in FIG. 13A through FIG. 13E. FIG. 13A through FIG. 13E illustrate atomic structure of $MoS_2$. FIG. 13A illustrates a monolayer of $MoS_2$ made of a honeycomb sheet of Molybdenum atoms covalently sandwiched between two honeycomb sheets of Sulfur atoms. Bulk of $MoS_2$ is formed by monolayers stacked and held on top of each other by van der Waals forces. FIG. 13B is a side-view illustrating a monolayer nanostructure. FIG. 13C is a side-view illustrating an example bi-layer nanostructure. FIG. 13D is a side-view illustrating an example tri-layer nanostructure. FIG. 13E is a side-view illustrating an example quad-layer nanostructure.

Strong intralayer covalent bonding, in contrast to weak interlayer van der Waals forces make it possible to fabricate high-quality monolayer $MoS_2$ by exfoliation technique. A desirable bandgap, comparable carrier mobility with those of Si thin film and Graphene nanoribbons together with excellent thermal stability and surface free from dangling bonds, makes 2D $MoS_2$ a very attractive candidate for device applications.

Figure 14:
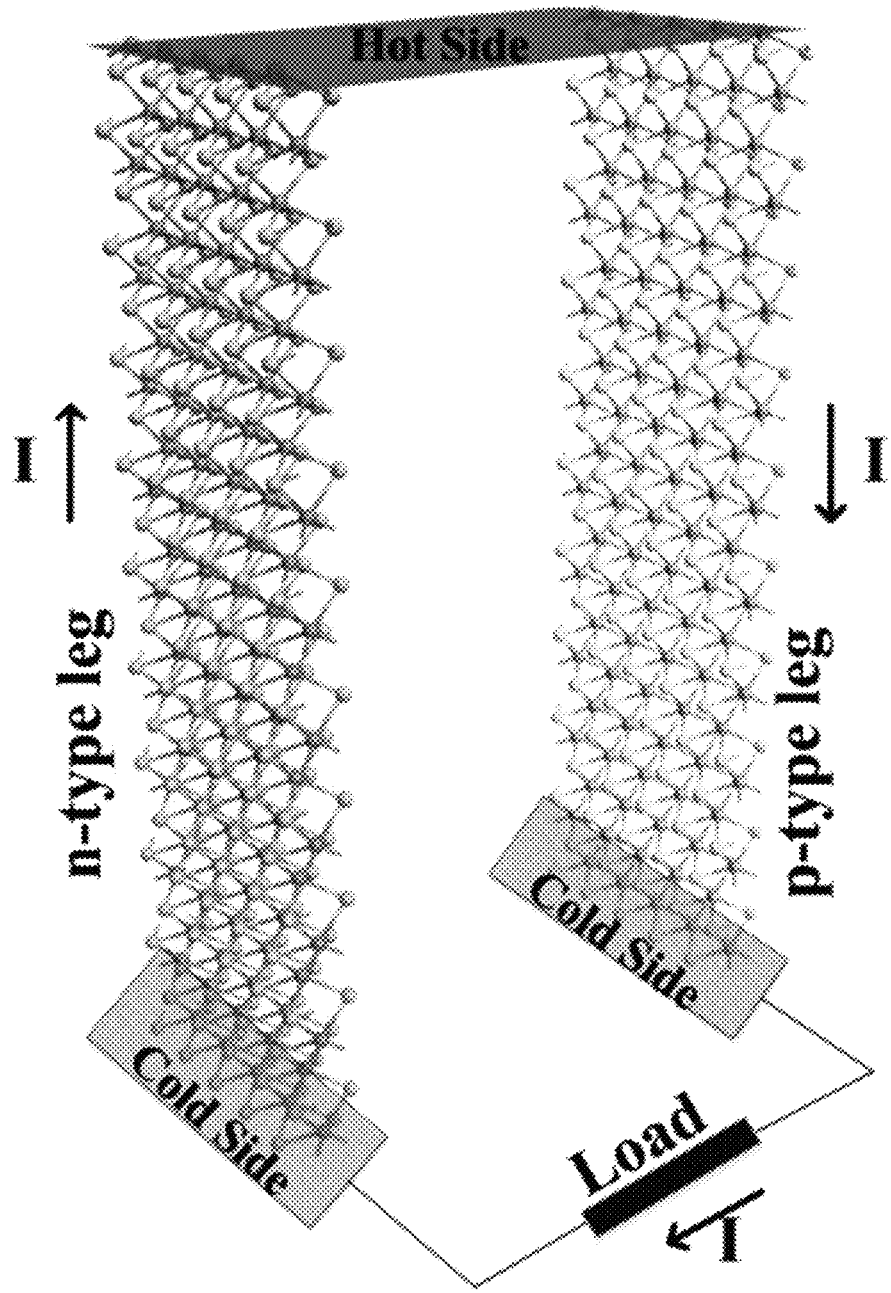
FIG. 14 illustrates the structure of an example thermoelectric generator based on monolayer $MoS_2$.

Compared to the research progress in its electronic and mechanical characteristics, thermoelectric (TE) properties of $MoS_2$ have not been widely studied. Thermoelectrics provide a way of converting thermal energy into electricity. Thermoelectric generator is expected to play an important role in increasing demand for clean energy in future. In general, a TE generator module is made of an array of thermocouples. FIG. 14 illustrates the structure of an example thermoelectric generator based on monolayer $MoS_2$. The thermoelectric generator comprises a p-type and an n-type semiconductor, known as legs. Temperature gradient across thermocouples can induce an electrical current through thermocouple based on thermoelectric phenomena. As illustrated in FIG. 14, each thermocouple, the basic unit of a TE generator, is made of a p-type and n-type semiconductors, named as legs, connected thermally in parallel and electrically in series. Temperature gradient across thermocouple is the driving force inducing electrical current.

The research on thermoelectric materials has been one of the major topics since 1950s when basic science of thermoelectrics was well founded. $Bi_2Te_3$ and the similar alloys have played a main role in the application of thermoelectric devices. It is well-known that efficiency of thermoelectric conversion can be evaluated by a dimensionless figure of merit $ZT=GS^2T/(\kappa_e+\kappa_{ph})$, in which G, S, $\kappa_e$, $\kappa_{ph}$ and T are electrical conductance, Seebeck's coefficient, electronic contribution to thermal conductance, phonon contribution to thermal conductance and absolute temperature, respectively. In order to have a high ZT, it is desirable to have a high electrical conductance and large Seebeck's coefficient and low thermal conductance. These parameters mainly depend on the intrinsic properties of materials and they are generally coupled with each other. Enhancement to one of them may degrade the other and the overall effect will not change. In three decades after 1950s, only incremental progress was made due to the difficulty in fine-tuning of these parameters.

Nanoscale structures may enhance thermoelectric efficiency. Quantum confinement of charge carriers in quantum-well super-lattices, quantum-wires as well as bulk samples containing nanostructured constituents may enhance thermoelectric conversion. Density of States (DOS) of low-dimensional materials exhibits sharp changes around Fermi level. As a result, Seebeck's coefficient, which depends on logarithmic derivative of DOS, is significantly enhanced, and hence, the ZT increases. In addition to an increase in Seebeck's coefficient, low dimensional materials benefit from higher phonon scattering and consequently lower phonon thermal conductance. Low phonon thermal conductivity ($\kappa_{ph}$) of $MoS_2$ thin films and disordered layered $WSe_2$ are about 0.1 W/mK to 1 W/mK30 and 0.05 W/mK31, respectively. In addition $MoS_2$ has anisotropic thermal properties, which provides another degree of freedom to optimize TE conversion performance. The advantage of nano-scale structures with respect to their large-scale counterparts motivates us to study thermoelectric properties of $MoS_2$ nanoribbon thermoelectric generators.

Thermoelectric properties of mono-, bi-, tri- and quadlayer armchair and zigzag $MoS_2$ nanoribbons are disclosed herein for electricity generation. ZT of bulk $MoS_2$ has already been reported to be 0.1 at 700K33. Effect of pressure on thermoelectric properties of $MoS_2$ is described herein. ZT increases up to 0.65 in a wide range of pressure and temperature. Thermoelectric performance of monolayer $MoS_2$ have been studied and ZT is reported to reach 0.58 in room temperature. In this disclosure, ZT values up to 1.2 were achieved which is higher than ZT values reported for large-scale $MoS_2$ structures. Well-established thermoelectric materials include PbTe and $Bi_2Te_3$ based alloys, from which higher ZT values around 2.4 have been already achieved at 900K. However, their substitution with abundant materials is favorable due to scarcity of Te element. This example discloses the forming high performance thermoelectric generator based on highly available $MoS_2$. In addition to abundance of $MoS_2$, nanoribbon structures have benefits of forming high density thermoelectric modules, due to their nano-scale size. In this disclosure, as the number of layers increases from monolayer to quadlayer nanoribbons, both transmission spectrum and phonon thermal conductance increased. In addition, strong electronic and thermal transport anisotropy was found between zigzag nanoribbons (ZZNR) and armchair nanoribbons (ACNR). Transmission coefficient and phonon thermal conductance of ZZNR was higher than those of ACNR with the same number of layers. Their effect on ZT was studied in this example. In addition to electronic and thermal anisotropy properties, monolayer $MoS_2$ nanoribbons show p-type behavior. The Fermi level in transmission spectrum was closer to valence band maximum. In contrast to monolayer nanoribbons, few-layer nanoribbons acted more n-type as Fermi level was closer to conduction band minimum. This phenomenon is very desirable since both p-type and n-type semiconductors are required to construct TE generators. It is an advantage that the same 2D materials can be used for both p-type and n-type semiconductor legs in a thermocouple. In addition, TE conversion of Si thin film TE generator with the same dimensions as $MoS_2$ nanoribbon TE generator has been studied by using Synopsys TCAD software39. The comparison indicated that $MoS_2$ nanoribbons exhibit much better TE conversion efficiency.

The computational model used in this example was based on self-consistent density functional tight-binding non-equilibrium Green's function (DFTB-NEGF) method implemented in QuantumWise ATK software package. Prior to the calculations of carrier transport, the structure has been relaxed to optimized force and stress of 0.02 eV/Å and 0.02 eV/Å3, respectively. The relaxation calculation was implemented by using Generalized Gradient Approximation (GGA) exchange correlation with a Double Zeta Polarized (DZP) basis set and a mesh cut-off energy of 75 Ha.

Figure 15A:
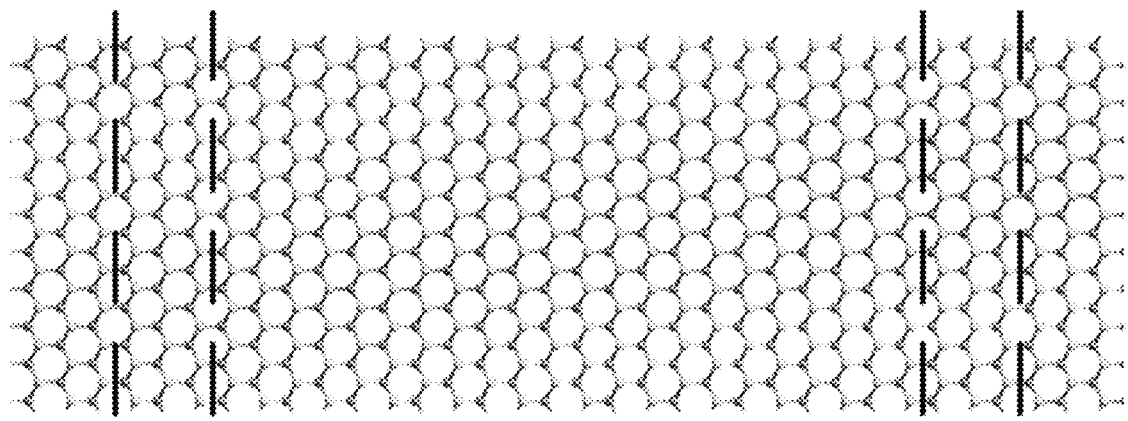
FIG. 15A is a view of an example nanostructure having an armchair molecular pattern.
Figure 15B:
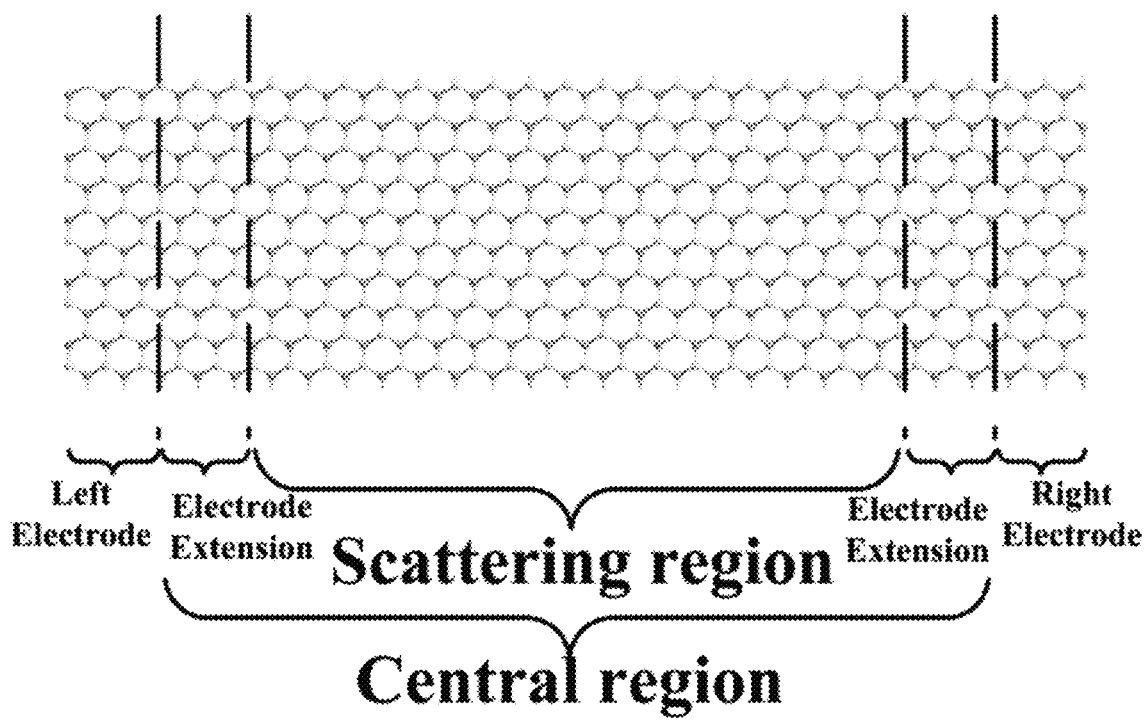
FIG. 15B is a view of an example nanostructure having a zigzag molecular pattern.

A top view of nanoribbons device structures described in this disclosure is illustrated in FIG. 15A and FIG. 15B. FIG. 15A is a view of an example nanostructure having an armchair molecular pattern. FIG. 15B is a view of an example nanostructure having a zigzag molecular pattern. Each device can comprise three regions: a left electrode, a central region and a right electrode. The Central region, itself, contains an extension of electrode regions on both sides and scattering region in the middle. Electrode regions are treated semi-infinitely. Their properties are computed by solving for bulk material. Temperature gradient is biased on electrode regions. Extension of electrode regions in central region, are used to screen out any perturbation introduced in scattering region. In order to have an insight on the effect of lattice direction and thickness on the intrinsic TE properties of nanoribbons, no perturbation was introduced in the scattering region in this work.

A central region, shown in FIG. 15A and FIG. 15B, should be large enough to accommodate both the voltage and temperature drop within itself. Due to computational constraints, 149, 299, 449 and 599 atoms supercell was used as central region in mono-, bi-, tri- and quadlayer devices, respectively. Using infinitesimal voltage and temperature drop, i.e. working in linear regime, makes the approximation valid. In addition, a vacuum spacing of 20 Å was added to each side of the device super cell to suppress any interaction caused by periodic boundary condition at out-of-plane direction.

In order to calculate linear transport properties of the system, Landauer-Buttiker formula was used, in which transport coefficients are calculated from Green's function. This formulism is correct in absence of inelastic scattering and phase-changing mechanisms. DFTB-NEGF method was chosen since it is proven to be a fast and computationally efficient method for a systems containing a large number of atoms, such as nanowires and nanoribbons. For DFTB calculations, semi-empirical Slater-Koster46 with DFTB-CP2K parameters available for Mo—S in Quantum Wise ATK was used. Monkhorst-Pack k-grid of 1×1×100 with a density mesh cut-off of 10 Ha was used for device supercell. Results of DFTB calculations using CP2K set have been shown to be in a good agreement with results of DFT calculations within Localized Density Approximation (LDA).

Electrical current I in the device at the linear transport regime is given by:

$$I = \frac{2q}{h} \int dE \cdot T(E) \cdot \{f_L(E, \mu_E) - f_R(E, \mu_R)\} \quad (1)$$

where factor 2 counts for spin degeneracy, q is electrical charge of carrier, h is Planck's constant, T(E) is transmission spectrum of device, $\mu_{L(R)}$ is chemical potential of left (right) electrodes and $f_{L(R)}(E, \mu_{L(R)})$ is the Fermi distribution of left (right) electrode. In linear response regime, it is assumed that $\Delta\mu = \mu_L - \mu_R$ and $\Delta T = T_L - T_R$ are infinitesimally small. As a result, equation (1) will be reduced to:

$$I = \frac{2q}{h} \int dE \cdot T(E) \cdot \left\{ -\frac{\partial f(E, \mu)}{\partial E} \right\} \quad (2)$$

Electronic contribution to TE properties, which is including electrical conductance (G), Seebeck's coefficient (S) and electronic thermal conductance ($\kappa_e$), can be calculated by using the followings:

$$G = qL_0 \quad (3)$$

$$S = \frac{L_1}{qTL_0} \quad (4)$$

$$\kappa_e = \frac{1}{T}\left(L_2 - \frac{L_1^2}{L_0}\right) \quad (5)$$

where $L_n$ is expressed as:

$$L_n = \frac{2}{h} \int_{-\infty}^{\infty} dE \cdot T(E) \cdot \left( -\frac{\partial f(E, \mu)}{\partial E} \right) \cdot (E - \mu)^n \quad (6)$$

Phonon transmission spectrum is calculated based on parameterization of Stillinger-Weber potential for $MoS_2$ as implemented in Quantum Wise ATK package. Phonon thermal conductance ($\kappa_{ph}$) can be calculated as:

$$\kappa_{ph} = \lim_{\Delta T \to 0} \frac{\frac{1}{h}\int_0^\infty dE \cdot T_{ph}(E) \cdot E \cdot \{B(E, T_L) - B(E, T_R)\}}{\Delta T} \quad (7)$$

where $T_{ph}(E)$ is phonon transmission spectrum; $B(E,T_L)$ and $B(E,T_R)$ are Bose-Einstein distribution of the left and right electrodes, respectively; $T_{L(R)}$ is temperature of left(right) electrode and E is energy of phonon. In linear response regime, $\Delta T = T_L - T_R \approx 0$ and equation (7) becomes:

$$\kappa_{ph} = \frac{1}{h}\int_0^\infty dE \cdot T_{ph}(E) \cdot E \cdot \left(-\frac{\partial B(E, T)}{\partial T}\right) \quad (8)$$

It is worth mentioning that the phonon thermal conductance calculations in this paper were performed in the absence of any phonon decaying mechanisms. Hence, the calculations set the upper limit for phonon thermal conductance of pure $MoS_2$. In reality however, there would be a few mechanisms which tend to suppress phonon conduction such as rough surface, edge imperfectness of ribbons, scattering centers, etc. ZT values calculated in this example was the minimum of what actually can be achieved by these materials. TE figure of merit is calculated by using the above information:

$$ZT = \frac{GS^2 T}{\kappa_e + \kappa_{ph}}. \quad (9)$$

Figure 16A:
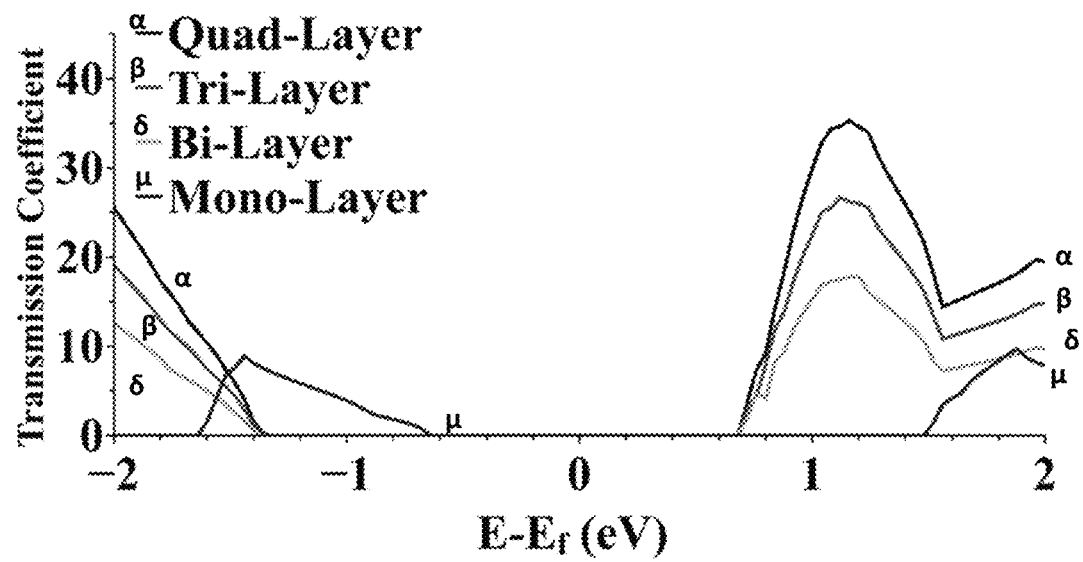
FIG. 16A is a graph illustrating transmission spectrum for ACNR for mono-, bi-, tri- and quadlayer $MoS_2$ calculated based on the DFTB-NEGF method.
Figure 16B:
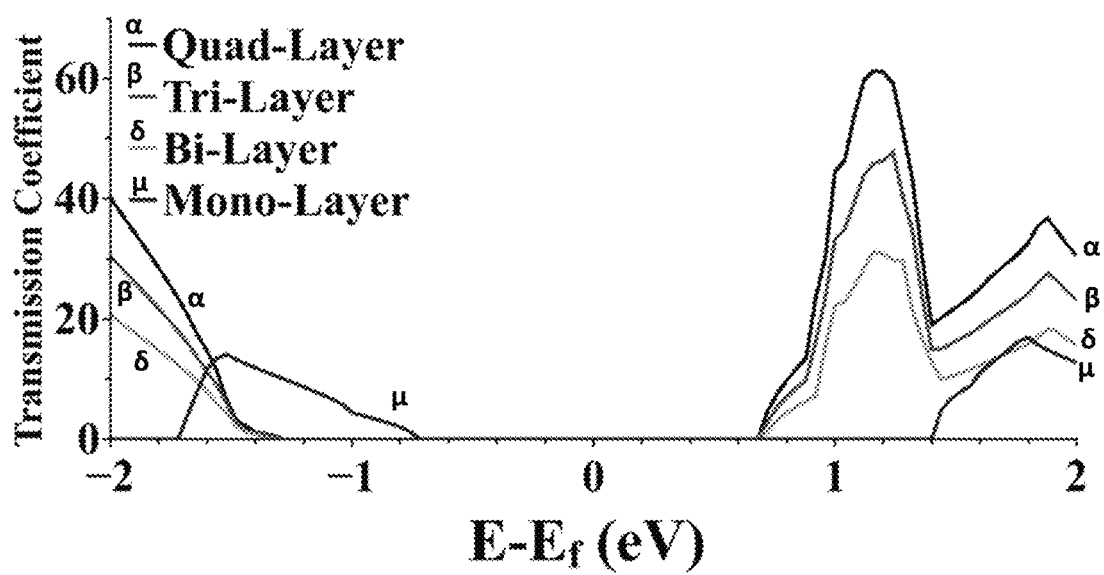
FIG. 16B is a graph illustrating transmission spectrum for ZZNR for mono-, bi-, tri- and quadlayer $MoS_2$ calculated based on DFTB-NEGF method.

The following are results and discussion of the methodology described above. Transmission spectrum characterizes the electrical behavior of the proposed devices. Electrical factors that affect TE figure of merit include electrical conductance (G), electronic thermal conductance ($\kappa_e$) and Seebeck's coefficient (S). These factors can be derived from transmission spectrum as described above. FIG. 16A is a graph illustrating transmission spectrum for ACNR for mono-, bi-, tri- and quadlayer $MoS_2$ calculated based on DFTB-NEGF method. FIG. 16B is a graph illustrating transmission spectrum for ZZNR for mono-, bi-, tri- and quadlayer $MoS_2$ calculated based on DFTB-NEGF method. Fermi level is closer to valence band maximum in monolayer nanoribbons and is closer to conduction band minimum in few-layer nanoribbons. Transmission profile of monolayer and multilayer $MoS_2$ nanoribbons are different from each other due to absence of interlayer van-der-Waals forces in monolayer nanoribbons. Fermi level for pristine nanoribbons was located at $E - E_f = 0$ and was closer to Valence Band Maximum (VBM) in monolayer nanoribbons while for few-layer nanoribbons was closer to Conduction Band Minimum (CBM). In other words, monolayer nanoribbons act more as p-type while few-layer nanoribbons act more as n-type. Few-layer nanoribbons have similar transmission spectrum profile which was totally different than those of monolayer nanoribbons. This inhomogeneity of transmission spectrums was due to absence of interlayer van der Waals forces in monolayer nanoribbons and symmetry breakage in nanoribbon structures. In a nanoribbon structure, symmetry is broken at two in-plane directions. This causes localized states in the middle of bandgap. Further study of FIG. 16A and FIG. 16B indicated that as the number of layers increased from two to four layers, the profile of transmission spectrum did not change. However, the amplitude of transmission spectrum increased, indicating that each layer provided an independent channel to conduct carriers. Furthermore, ZZNR was found to have higher transmission amplitude in comparison with ACNR. It was expected to be more conductive than ACNR consequently.

Figure 17A:
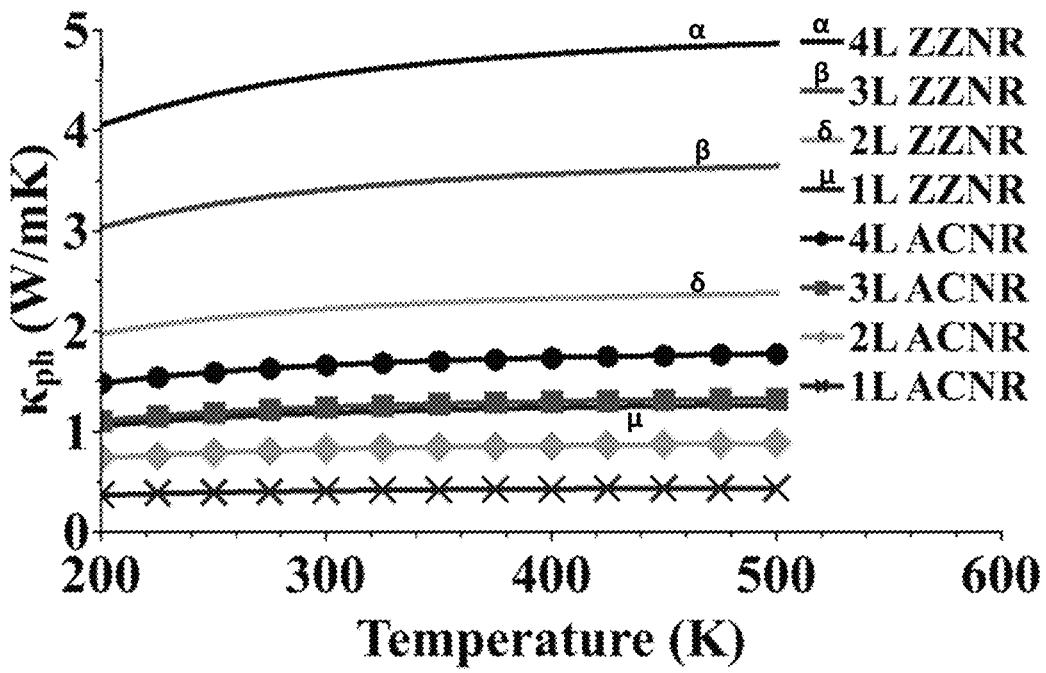
FIG. 17A is a graph illustrating kph vs. temperature for monolayer and few-layer $MoS_2$ ACNR and ZZNR.
Figure 17B:
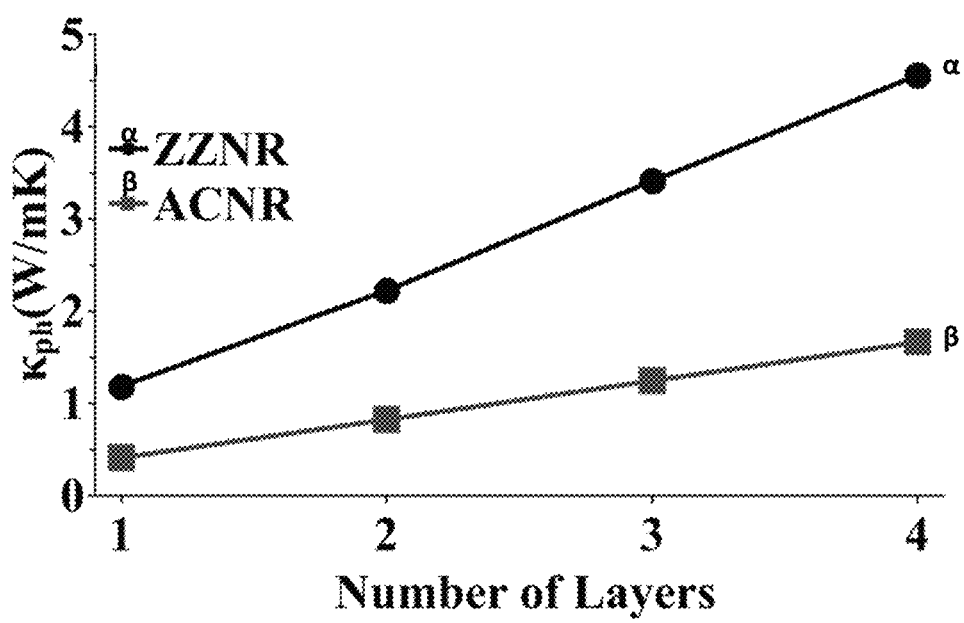
FIG. 17B is a graph illustrating kph vs. number of layers for ACNR and ZZNR.
Figure 18A:
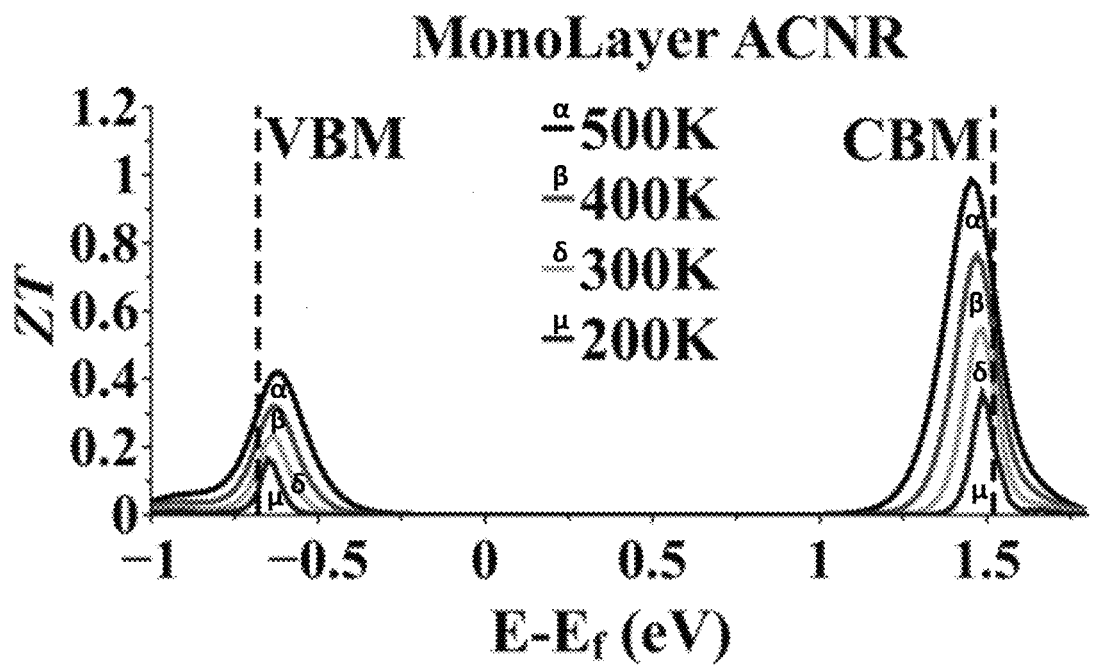
FIG. 18A is a graph illustrating $E-E_f$ and ZT for monolayer ACNR.
Figure 18B:
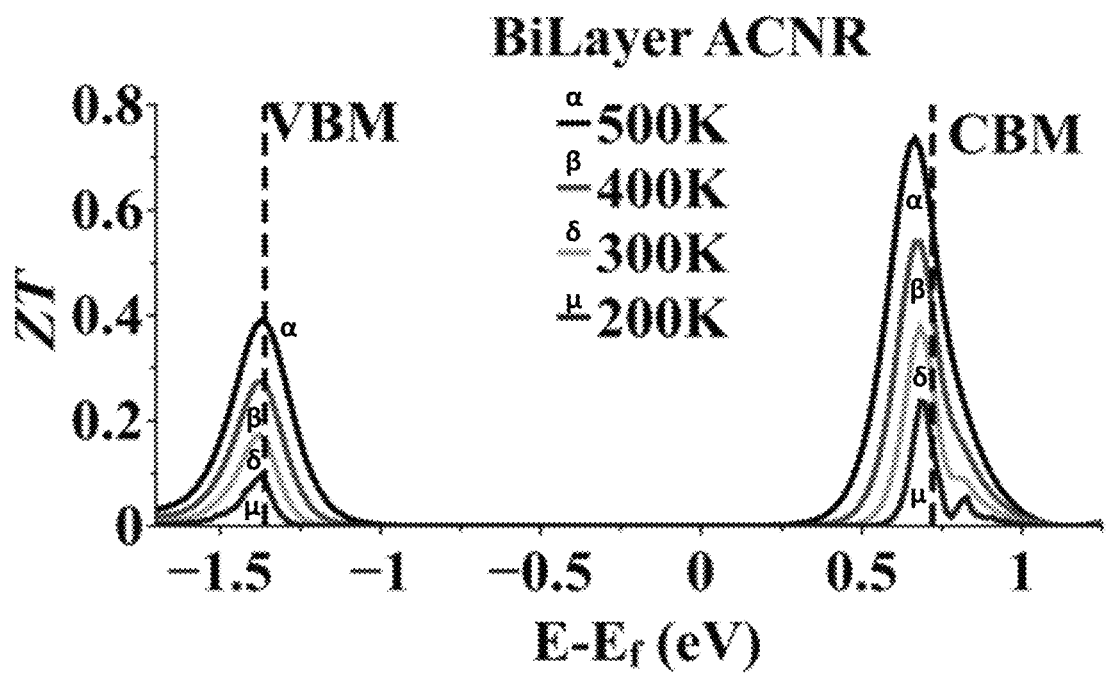
FIG. 18B is a graph illustrating $E-E_f$ and ZT for bilayer ACNR.
Figure 18C:
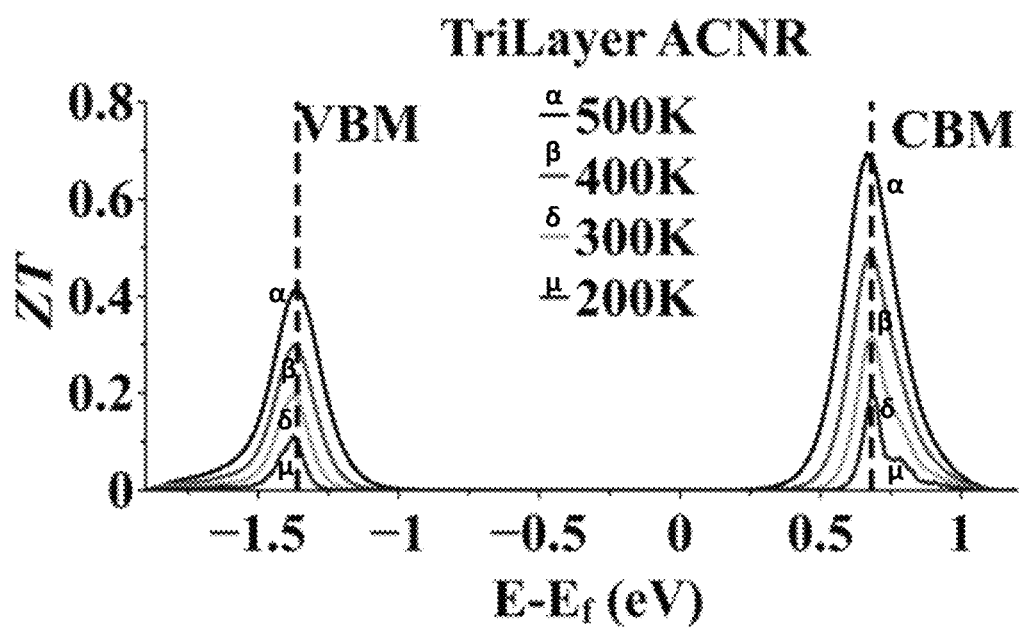
FIG. 18C is a graph illustrating $E-E_f$ and ZT for trilayer ACNR.
Figure 18D:
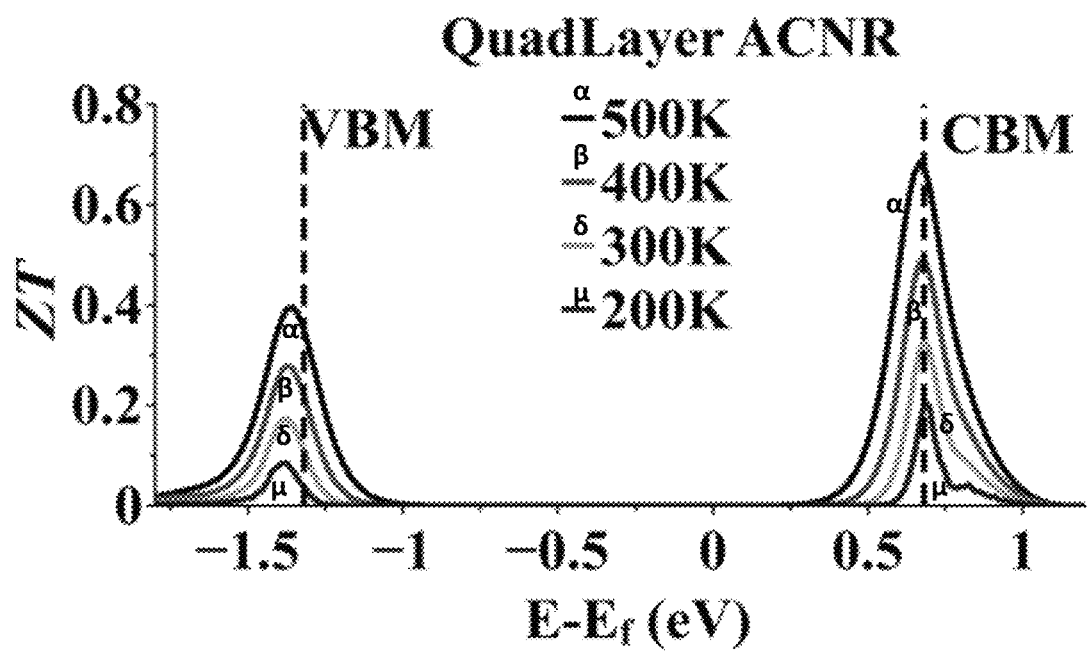
FIG. 18D is a graph illustrating $E-E_f$ and ZT for quadlayer ACNR.
Figure 18E:
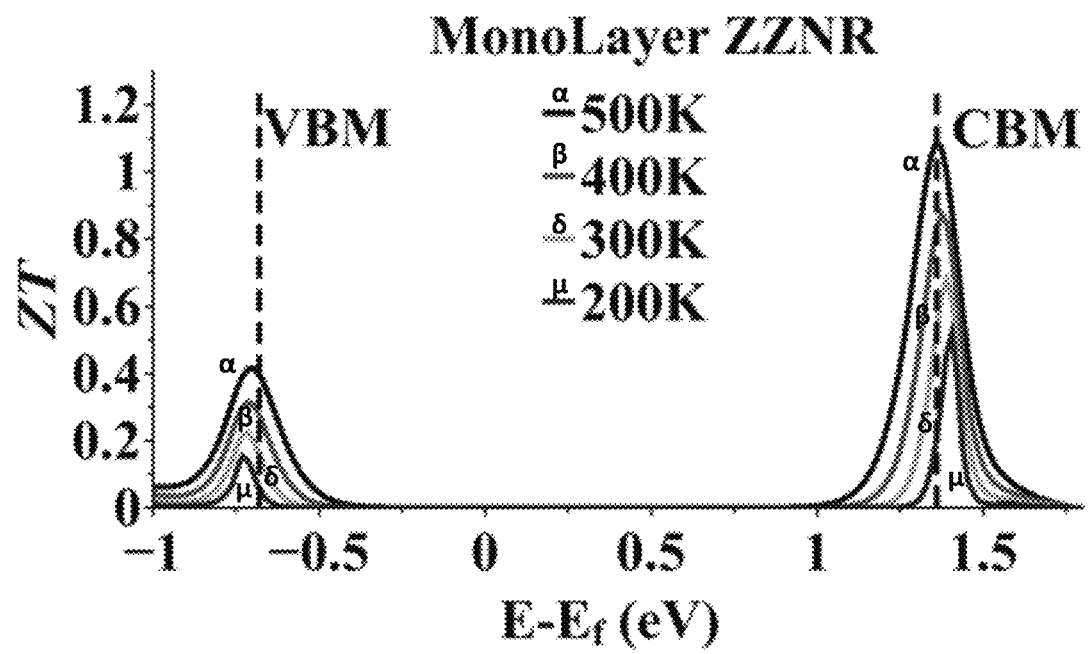
FIG. 18E is a graph illustrating $E-E_f$ and ZT for monolayer ZZNR.
Figure 18F:
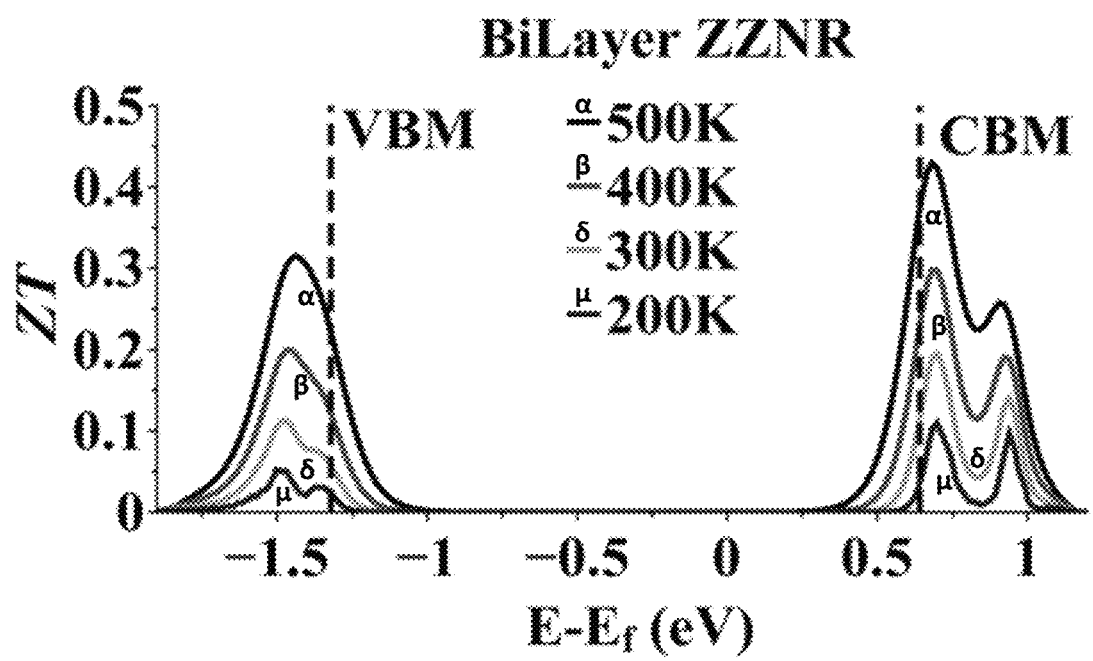
FIG. 18F is a graph illustrating $E-E_f$ and ZT for bilayer ZZNR.
Figure 18G:
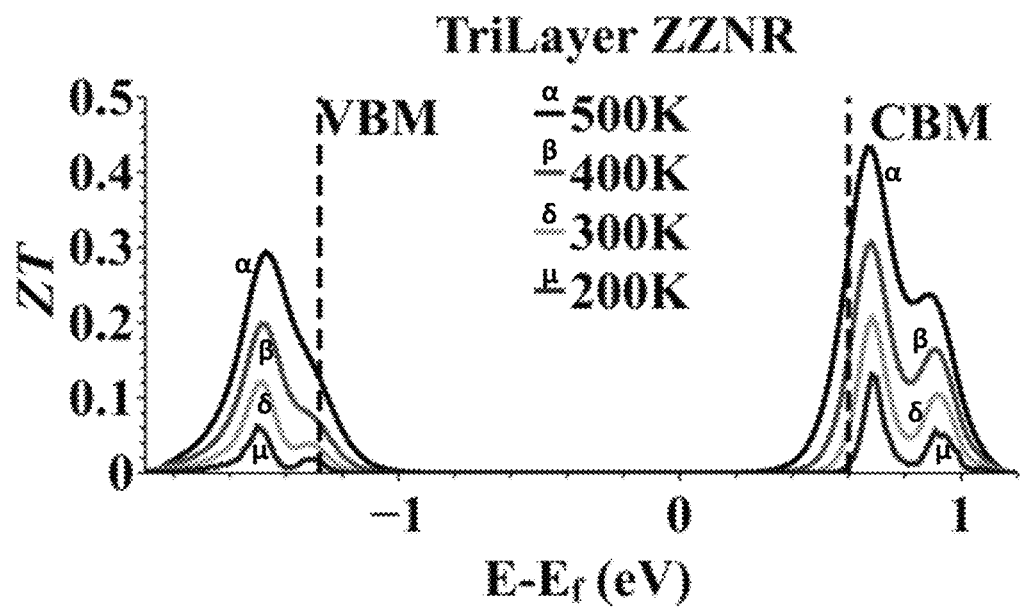
FIG. 18G is a graph illustrating $E-E_f$ and ZT for trilayer ZZNR.
Figure 18H:
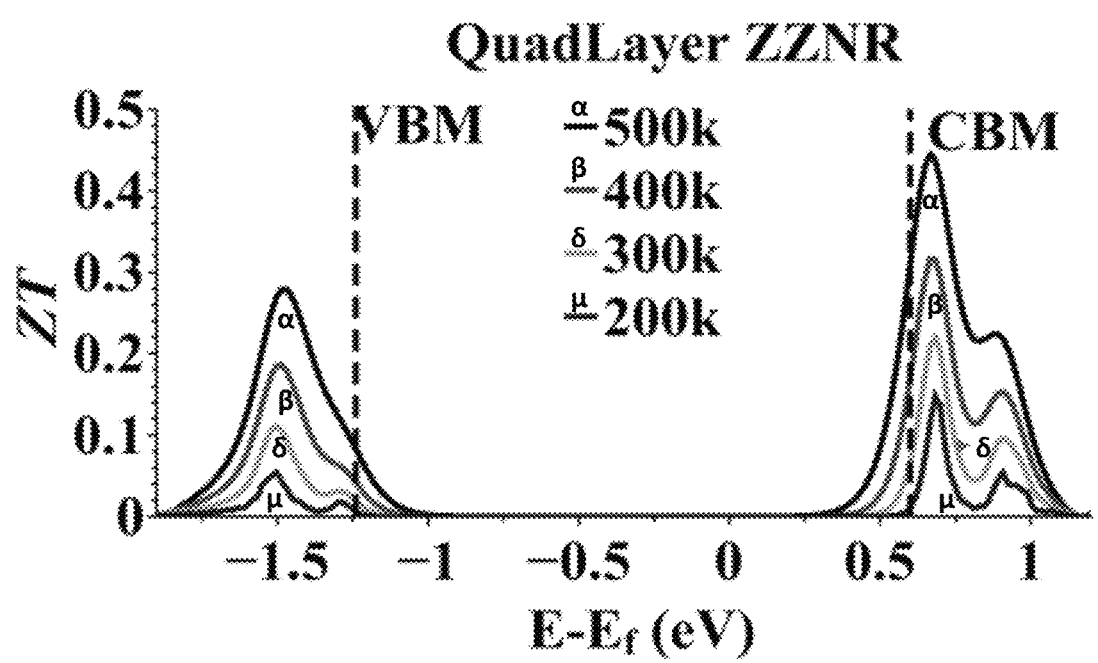
FIG. 18H is a graph illustrating $E-E_f$ and ZT for quadlayer ZZNR.
Figure 19A:
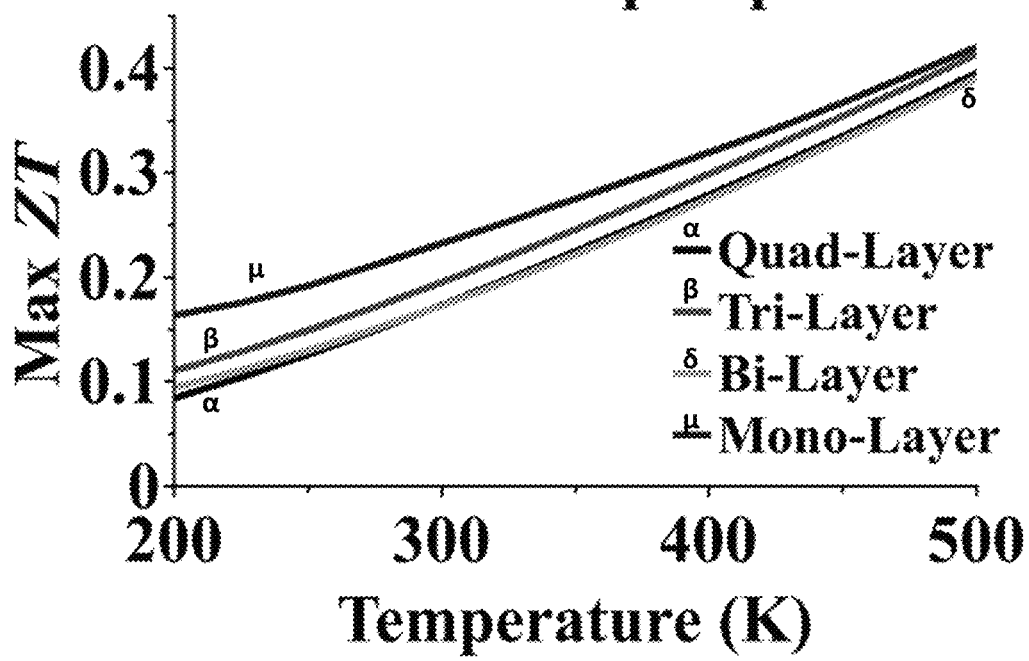
FIG. 19A is a graph illustrating temperature and Max ZT for p-doped ACNR.
Figure 19B:
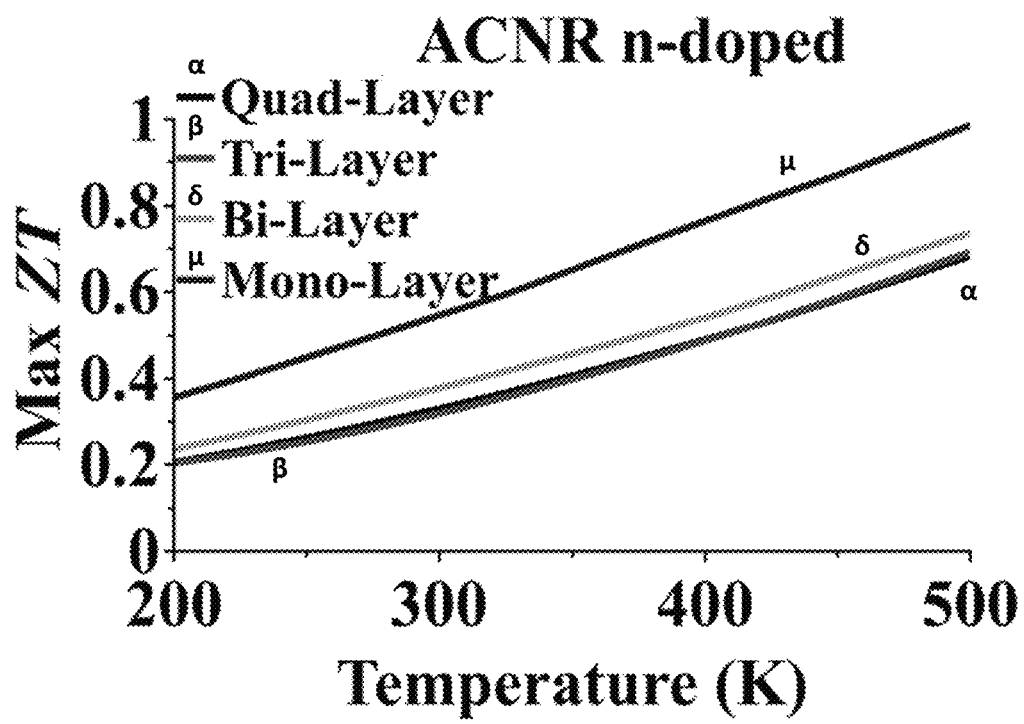
FIG. 19B is a graph illustrating temperature and Max ZT for n-doped ACNR.
Figure 19C:
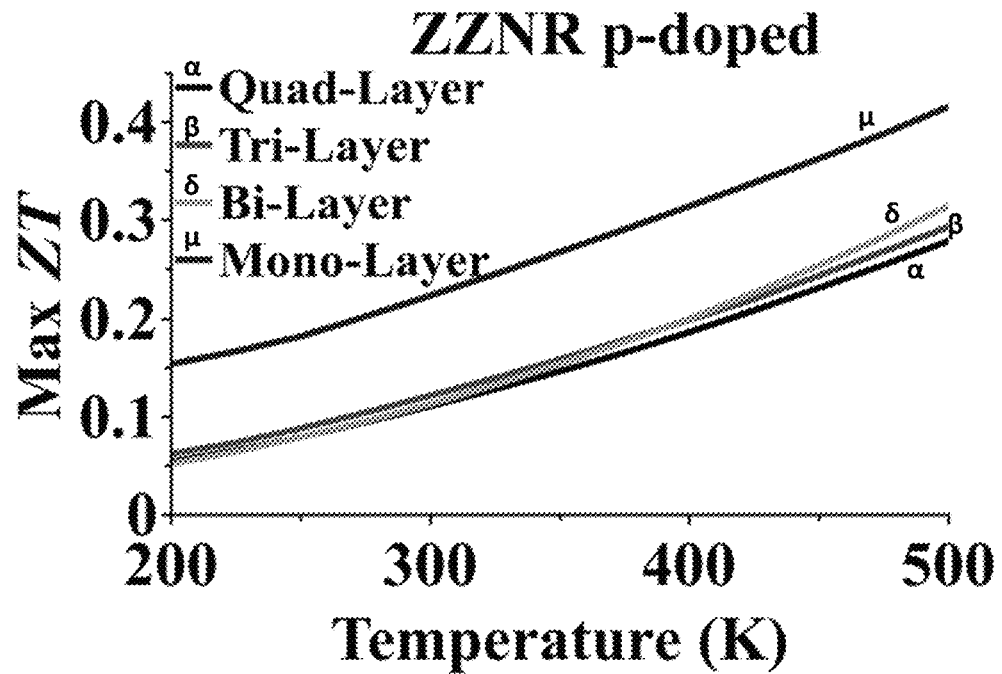
FIG. 19C is a graph illustrating temperature and Max ZT for p-doped ZZNR.
Figure 19D:
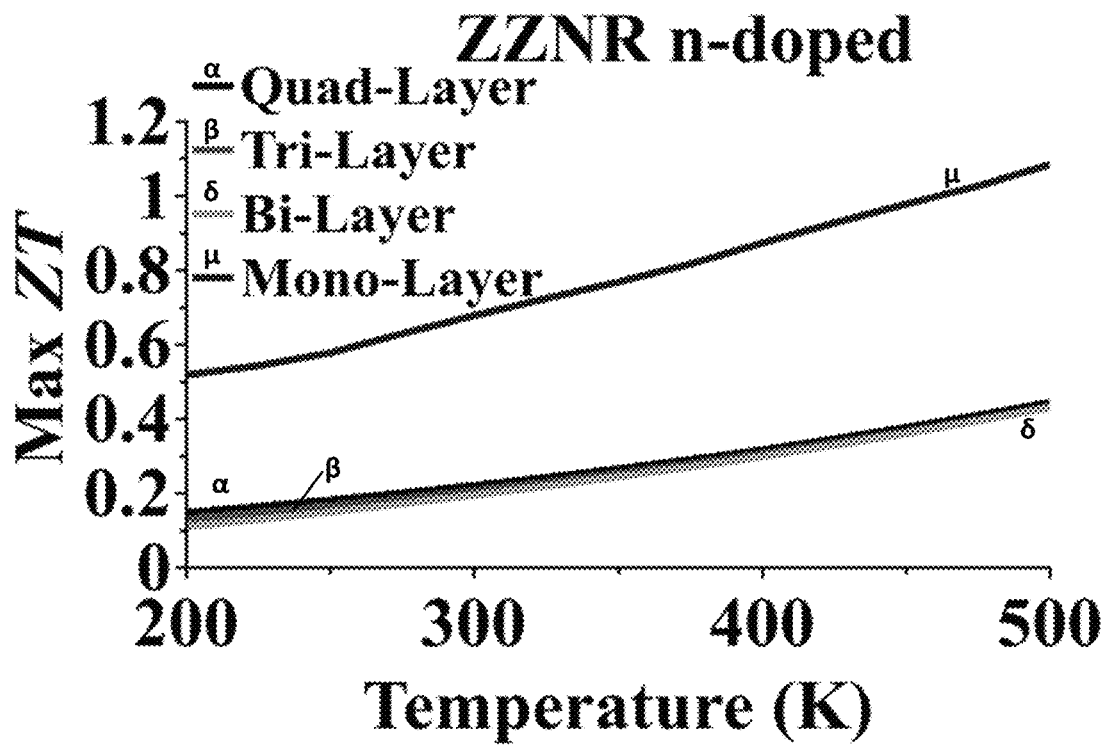
FIG. 19D is a graph illustrating temperature and Max ZT for n-doped ZZNR.

In semiconducting materials, phonon thermal conductance ($\kappa_{ph}$) is several times larger than $\kappa_e$ and outplays the impact of $\kappa_e$ on TE figure of merit. $\kappa_{ph}$ of monolayer and few-layer ACNR and ZZNR vs. temperature were illustrated in FIG. 17A and FIG. 17B. FIG. 17A is a graph illustrating kph vs. temperature for monolayer and few-layer $MoS_2$ ACNR and ZZNR. FIG. 17B is a graph illustrating kph vs. number of layers for ACNR and ZZNR. The value of kph for ZZNR shows higher values and greater rate of increase as number of layers increases from monolayer to quadlayer than those for ACNR. As shown in FIG. 17A and FIG. 17B, $\kappa_{ph}$ was almost independent of temperature. It was closely a constant in a wide range of temperatures (from 200K to 500K). In addition, ZZNR showed larger $\kappa_{ph}$ than ACNR due to the alignment of one vibrational mode in transport direction along zigzag orientation. These results also suggested that $\kappa_{ph}$ of both ZZNR and ACNR increased as the number of layers increased. The rate of increase in $\kappa_{ph}$ was more in ZZNR than in ACNR.

From factors playing role in TE figure of merit, G and $\kappa_e$ follow the profile of transmission spectrum, i.e. as the Fermi level moves into valence or conduction bands, transmission increases, and hence, there are more carriers to be conducted both thermally and electrically. In contrast to G and $\kappa_e$, it is typical for semiconductor materials that Seebeck's coefficient (S) decreases as Fermi level moves into valence and conduction bands. Therefore G and S are competing with each other and their product in the form of $S^2G$, known as power factor, reaches its maximum at an optimum position of Fermi energy.

ZT values of monolayer and few-layer $MoS_2$ ACNR and ZZNR vs. Fermi level position at four temperatures were illustrated in FIG. 18A through FIG. 18H. FIG. 18A through FIG. 18G illustrate thermoelectric figure of merit for monolayer and few-layer $MoS_2$ ACNR and ZZNR vs. Fermi level position for four temperatures. Conduction band minimum (CBM) and valence band maximum (VBM) are shown by vertical dashed lines in each plot. There were two main peaks in ZT, separated by a bandgap, corresponding to valence band and conduction band. VBM and CBM were specified in each plot by vertical dashed lines. Fermi level position for pristine nanoribbons was at $E-E_f=0$. In this example, TE figure of merit was referred to as ZT of n-doped or ZT of p-doped as Fermi level was approaching conduction band or valence band, respectively. It is shown in FIG. 18A through FIG. 18H that for all monolayer and few-layer nanoribbons, ZT values of n-doped nanoribbons were higher than those of p-doped.

As temperature increased, amplitude of ZT also increased since ZT was proportional to the temperature. In addition, rising temperature broadens Fermi distribution. This broadening will populate states in energies higher than Fermi level, which were unpopulated in lower temperatures. These newly occupied states contribute to both electrical and thermal conduction. It means that electrical conductance increases in energies which has insignificant contribution to conduction in lower temperatures, resulting in broadening of ZT peaks vs. energy. Further study of FIG. 18A through FIG. 18H showed that in ZT of n-doped few-layer ZZNR, there were two peaks and as temperature increased the second peak merged into the first peak. This pattern was not seen in ZT of n-doped few-layer ACNR. This behavior was attributed to the narrower peak in few-layer ZZNR transmission spectrum in conduction band, compared to that of ACNR seen in FIG. 16A. Transmission spectrums for both few-layer ACNR and ZZNR in conduction band were composed of two peaks. Fall of transmission spectrum in conduction band, between these two peaks, was sharper for ZZNR compared to that of ACNR. As Fermi level approaches the point at which transmission spectrum falls, ZT also decreased due to decrease in transmission modes. This phenomenon was more dramatic in lower temperatures since in higher temperatures, as described above, broadening of Fermi distribution compensates lack of transmission modes by populating states in higher energies. As a result, by increasing temperature, two ZT peaks merged together. Broader transmission spectrum of few-layer ACNR in conduction band compared to that of ZZNR, made this double-peak characteristic in ZT profile far less pronounced, even in low temperatures.

Peak values of ZT for p-doped and n-doped monolayer and few-layer ACNR and ZZNR vs. temperature were shown in FIG. 19A through FIG. 19D. FIG. 19A through FIG. 19D are graphs illustrating Max ZT for p-doped and n-doped monolayer and few-layer ACNR and ZZNR vs. temperature. As it was expected from equation (9), ZT was quite linear with temperature. Monolayer nanoribbons have higher ZT in both n-doped and p-doped plots compared to few-layer nanoribbons. ZT values were larger than unity in both n-doped monolayer ACNR and ZZNR at T=500K However, it was shown by transmission spectrum that monolayer nanoribbons were more p-type than n-type. More doping is needed to shift the Fermi level close to conduction band rather than valence band and hence take advantage of high ZT values of n-doped monolayer nanoribbons. Therefore, for n-type leg in thermocouple, few-layer nanoribbons were more preferred. Results in FIG. 19A through FIG. 19D show that bilayer ACNR exhibited the highest n-doped ZT compared to the other few-layer structures and was the best material to be implemented as n-type leg in thermocouples.

Figure 20A:
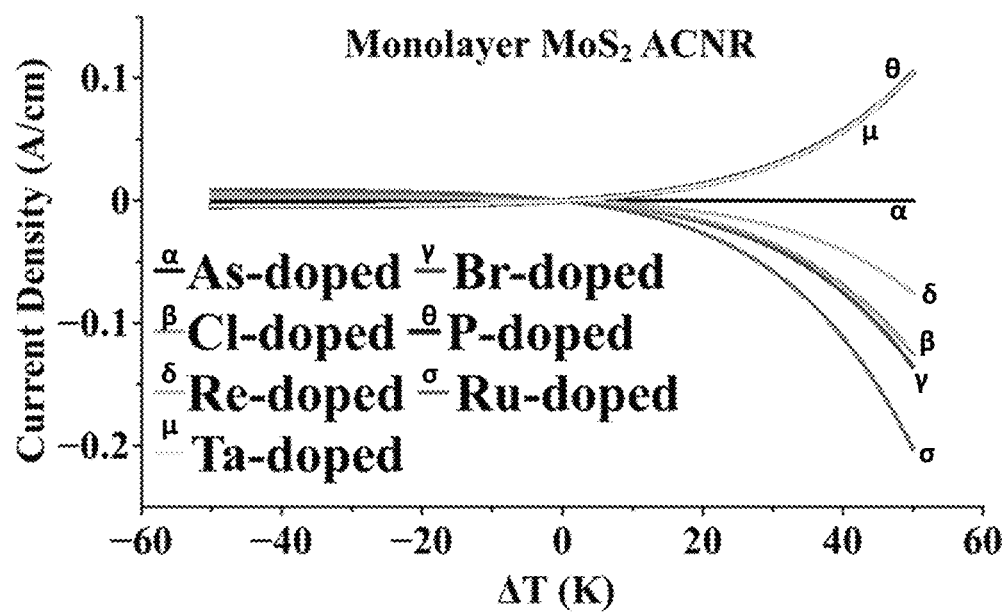
FIG. 20A is a graph illustrating thermoelectric current of monolayer $MoS_2$ ACNR substitutionally doped with various dopants vs. temperature gradient.
Figure 20B:
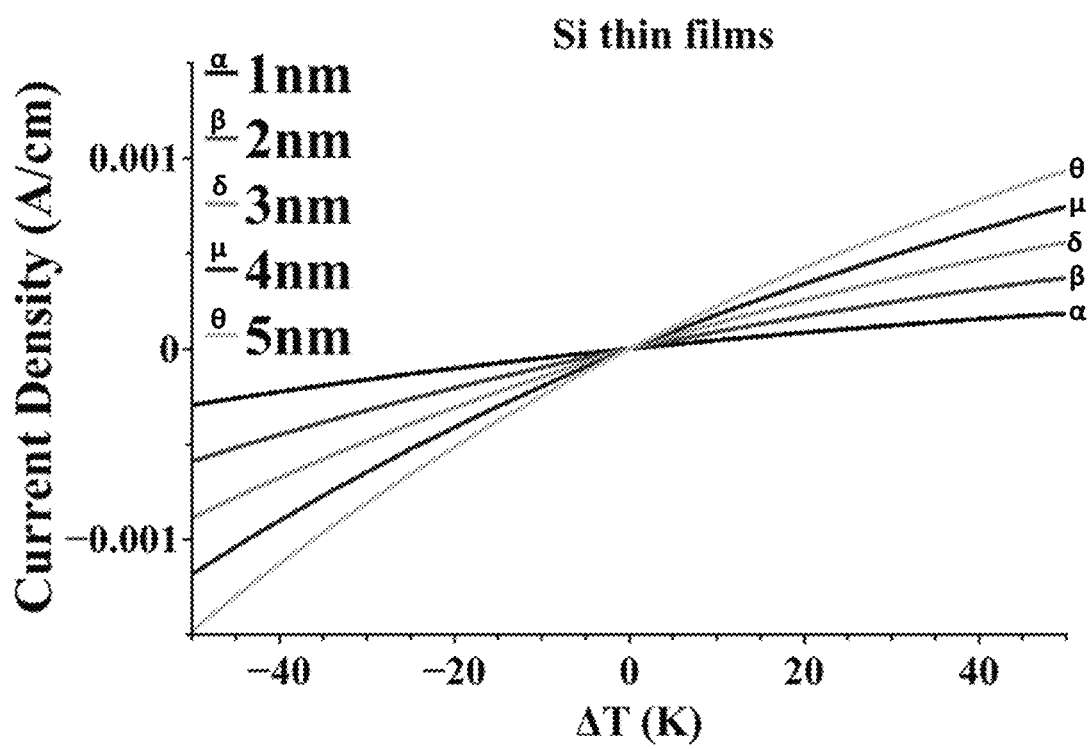
FIG. 20B is a graph illustrating thermoelectric current of Si thin films doped p-type for different film thicknesses vs. temperature gradient across films.

As discussed previously, in order to take advantage of the highest ZT value possible, $MoS_2$ nanoribbons can be doped in order to shift Fermi level to energy of peak values of ZT profile. Substitutional doping of TMD samples has been observed experimentally under exposure to 80 keV electron beam irradiation. Also, a first principal study of effect of this doping approach for transition metal dopants as well as non-metal dopants is reported. In order to examine the TE current of $MoS_2$ nanoribbons, a monolayer ACNR doped with various dopant species was simulated. The same substitutional approach for doping the ACNR was followed. Transition metal atoms (e.g., Re, Ru and Ta) were used as the replacing dopants for Molybdenum, and non-transition metal atoms (e.g., As, Br, Cl and P) are used for Sulfur. In order to screen out the perturbation caused by doping properly, only one dopant atom was inserted in central region of device. A temperature gradient was set across the nanoribbon by fixing the temperature of right electrode to T=300K and changing temperature of left electrode from T=250K to T=350K (for device configuration, see FIG. 15A and FIG. 15B). Results are shown in FIG. 20A and FIG. 20B. FIG. 20A is a graph illustrating thermoelectric current of monolayer $MoS_2$ ACNR substitutionally doped with various dopants vs. temperature gradient across nanoribbons. Transition metal dopants replace Molybdenum and non-metal dopants replace Sulfur. FIG. 20B is a graph illustrating thermoelectric current of Si thin films doped p-type for different film thicknesses vs. temperature gradient across films. TE current of ACNR shows strong dependence on the type of dopant atom. While Arsenic does not show any effect on thermoelectric current, P and Ta showed a similar boost to current. For n-type dopant, Ru exhibits the best current boost in comparison with other dopants. It should be noted that doping in $MoS_2$ monolayer at nanoscale will induce device to device performance variation.

These results were compared with TE current of Si thin film doped with acceptor (B) concentration of $N_A=1\times10^{16}$ cm$^{-3}$ with various film thicknesses (also shown in FIG. 14). For Si thin film with film thickness of t=5 nm, TE current density reached $J\approx0.001$ A/cm at $\Delta T=50K$. In comparison, monolayer Ru-doped $MoS_2$ ACNR had TE current density $J\approx0.2$ A/cm at $\Delta T=50K$, more than two orders of magnitude larger. Decreasing thickness of Si film made them more resistive and TE current decreased consequently, as shown in FIG. 20B. Superiority of $MoS_2$-based thermocouples will be more dramatic if its TE performance was compared with those of thinner Si films, especially 1 nm-thick Si films which is almost the same thickness of monolayer $MoS_2$.

Figure 21:
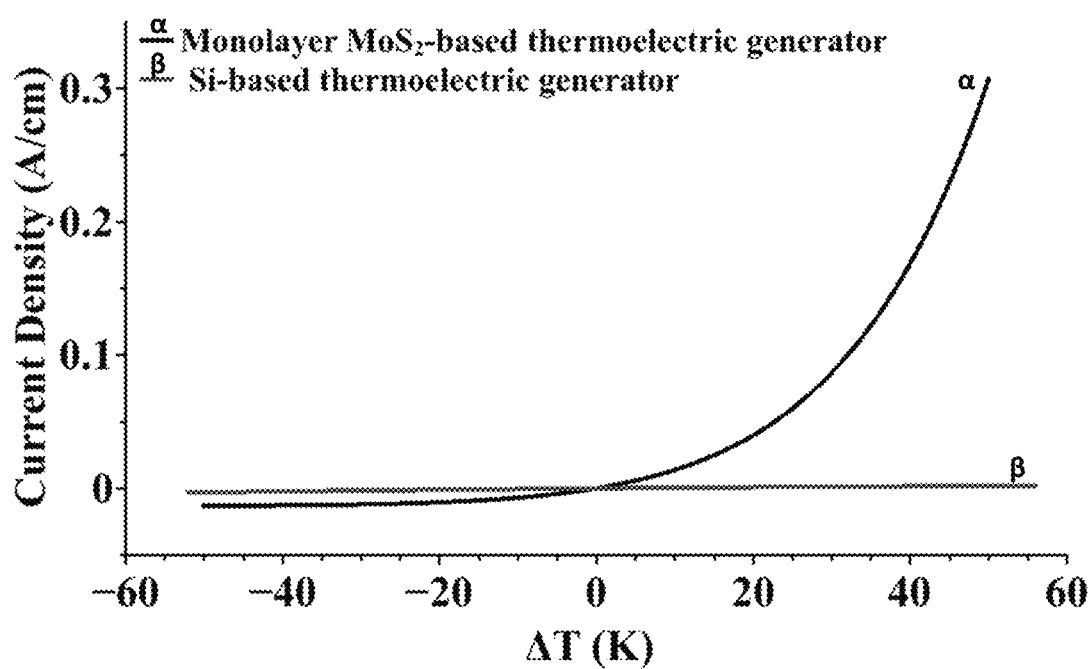
FIG. 21 is a graph illustrating thermoelectric current of thermoelectric generators based on Si thin film in comparison with that of based on monolayer $MoS_2$.

Thermocouples, as was mentioned in previous section, are made of both p-type and n-type semiconductors. In order to compare the performance of monolayer $MoS_2$-based and Si-based thermocouples, TE current of both of these materials was illustrated in FIG. 21. FIG. 21 is a graph illustrating thermoelectric current of thermoelectric generators based on Si thin film in comparison with that of based on monolayer $MoS_2$. For Si-based thermocouples, p-doped (B) and n-doped (As) films with thickness of t=5 nm and with doping concentration of $N_{A,D}=1\times10^{16}$ cm$^{-3}$ was used. For monolayer $MoS_2$ TE conversion, Ru-doped and P-doped nanoribbons were the best n-type and p-type nanoribbons, respectively. These two nanoribbons were chosen to construct the thermocouple based on monolayer $MoS_2$. FIG. 21 shows that thermocouples based on monolayer $MoS_2$ were far more superior to thermocouples based on Si thin films.

In summary, a TE generator based on monolayer and few-layer $MoS_2$ nanoribbons was disclosed. In order to find the optimum structure for the proposed thermocouple, first-principle simulation was performed to calculate TE figure of merit ZT for monolayer and few-layer $MoS_2$ ACNR and ZZNR. It was shown that in monolayer $MoS_2$ nanoribbons, Fermi level was closer to valence band in contrast to few-layer nanoribbons where it is closer to conduction band. This behavior is desirable since the same 2D material can be used as p-type and n-type semiconducting leg in thermocouple, hence simplifying fabrication process. Monolayer $MoS_2$ ACNR was shown to have the highest ZT value as p-type semiconducting leg, while among few-layer nanoribbons, bilayer $MoS_2$ ACNR showed the highest ZT value as n-type semiconductor leg. Moreover, compared to Si films, $MoS_2$ monolayer nanoribbons were two orders better in achieving higher TE current.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A device comprising:
  a first nanoribbon comprising bi-layer n-type molybdenum disulfide with atoms arranged in an armchair pattern;
  a second nanoribbon comprising monolayer p-type molybdenum disulfide with atoms arranged in an armchair pattern;
  an electrical interconnect coupling the first nanoribbon to the second nanoribbon;
  a first electrode coupled to the first nanoribbon; and
  a second electrode coupled to the second nanoribbon, wherein the first nanoribbon and the second nanoribbon provide electrical energy, via one or more of the first electrode or the second electrode, in response to receiving thermal energy at one or more of the first nanoribbon or the second nanoribbon.

2. The device of claim 1, wherein the bi-layer n-type molybdenum disulfide of the first nanoribbon is doped with chlorine.

3. The device of claim 1, wherein the monolayer p-type molybdenum disulfide of the second nanoribbon is doped with phosphorus.

4. The device of claim 1, wherein the first nanoribbon is arranged within a cell of an array of thermoelectric generating cells of a thermocouple.

5. The device of claim 1, wherein the second nanoribbon is arranged within a cell of an array of thermoelectric generating cells of a thermocouple.

6. The device of claim 1, wherein the electrical interconnect is arranged within a cell of an array of thermoelectric generating cells of a thermocouple.

7. The device of claim 1, wherein the first nanoribbon is disposed thermally in parallel to the second nanoribbon.

8. The device of claim 1, wherein the first nanoribbon is disposed electrically in series with the second nanoribbon.

9. A device comprising:
  a first nanoribbon comprising bi-layer n-type molybdenum disulfide with atoms arranged in an armchair pattern;
  a second nanoribbon comprising monolayer p-type molybdenum disulfide with atoms arranged in an armchair pattern; and
  an electrical interconnect coupling the first nanoribbon to the second nanoribbon,
    wherein the first nanoribbon, the second nanoribbon, and the electrical interconnect are arranged as a cell in an array of thermoelectric generating cells of a thermocouple.

10. The device of claim 9, further comprising:
a first electrode coupled to the first nanoribbon; and
a second electrode coupled to the second nanoribbon, wherein the first nanoribbon and the second nanoribbon provide electrical energy, via one or more of the first electrode or the second electrode, in response to receiving thermal energy.

11. The device of claim 9, wherein the bi-layer n-type molybdenum disulfide of the first nanoribbon is doped with chlorine.

12. The device of claim 9, wherein the monolayer p-type molybdenum disulfide of the second nanoribbon is doped with phosphorus.

13. The device of claim 9, wherein the first nanoribbon is disposed thermally in parallel to the second nanoribbon.

14. The device of claim 9, wherein the first nanoribbon is disposed electrically in series with the second nanoribbon.

15. The device of claim 10, wherein the first nanoribbon and the second nanoribbon provide electrical energy, via one or more of the first electrode or the second electrode, in response to receiving the thermal energy at one or more of the first nanoribbon or the second nanoribbon.

* * * * *